(12) United States Patent
Nara

(10) Patent No.: US 12,030,136 B2
(45) Date of Patent: Jul. 9, 2024

(54) PROCESSING DEVICE

(71) Applicant: HAMAMATSU PHOTONICS K.K., Hamamatsu (JP)

(72) Inventor: Yasunaga Nara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 953 days.

(21) Appl. No.: 16/964,268

(22) PCT Filed: Jan. 23, 2019

(86) PCT No.: PCT/JP2019/002112
§ 371 (c)(1),
(2) Date: Jul. 23, 2020

(87) PCT Pub. No.: WO2019/146653
PCT Pub. Date: Aug. 1, 2019

(65) Prior Publication Data
US 2021/0031308 A1 Feb. 4, 2021

(30) Foreign Application Priority Data
Jan. 29, 2018 (JP) .................. 2018-012604

(51) Int. Cl.
*B23K 26/53* (2014.01)
*B23K 26/06* (2014.01)
(Continued)

(52) U.S. Cl.
CPC .......... *B23K 26/53* (2015.10); *B23K 26/0608* (2013.01); *B23K 26/0622* (2015.10);
(Continued)

(58) Field of Classification Search
CPC ................ B23K 26/53; B23K 26/0608; B23K 26/0622; B23K 26/064; B23K 26/0676; B23K 26/0626; B23K 26/083; B23K 2103/56; B23K 2103/50; B23K 26/402; B23K 26/38; B23K 26/067; H01L 21/67092; H01L 21/67115; H01L 21/304;
(Continued)

(56) References Cited

U.S. PATENT DOCUMENTS

2016/0096233 A1  4/2016 Duan et al.

FOREIGN PATENT DOCUMENTS

| CN | 1853840 A | 11/2006 |
| CN | 102896418 A | 1/2013 |

(Continued)

OTHER PUBLICATIONS

International Preliminary Report on Patentability dated Aug. 13, 2020 for PCT/JP2019/002112.

*Primary Examiner* — Robert G Bachner
(74) *Attorney, Agent, or Firm* — Faegre Drinker Biddle & Reath LLP

(57) ABSTRACT

A processing device forms, in an object to be processed, a modified spot constituting a modified region. The processing device includes a first irradiation unit configured to irradiate the object with first light to temporarily increase absorptivity in a partial region of the object as compared with the absorptivity before irradiation of the first light, and a second irradiation unit configured to irradiate the partial region with second light in an absorptivity increase period in which the absorptivity of the partial region is temporarily increased.

16 Claims, 25 Drawing Sheets

(51) Int. Cl.
  *B23K 26/0622* (2014.01)
  *B23K 26/064* (2014.01)
  *B23K 26/067* (2006.01)
  *B23K 26/08* (2014.01)
  *B23K 103/00* (2006.01)
  *G02B 27/14* (2006.01)
  *G02B 27/28* (2006.01)
  *H01L 21/67* (2006.01)
  *H10N 30/088* (2023.01)

(52) U.S. Cl.
  CPC ........ *B23K 26/064* (2015.10); *B23K 26/0676* (2013.01); *H01L 21/67092* (2013.01); *H01L 21/67115* (2013.01); *H10N 30/088* (2023.02); *B23K 26/0626* (2013.01); *B23K 26/083* (2013.01); *B23K 2103/56* (2018.08); *G02B 27/141* (2013.01); *G02B 27/283* (2013.01)

(58) Field of Classification Search
  CPC ... H10N 30/088; G02B 27/141; G02B 27/283
  See application file for complete search history.

(56) References Cited

FOREIGN PATENT DOCUMENTS

| | | |
|---|---|---|
| CN | 104117775 A | 10/2014 |
| JP | 2003-205383 A | 7/2003 |
| JP | 2005-178288 A | 7/2005 |
| JP | 2005-305470 A | 11/2005 |
| JP | 2013-022627 A | 2/2013 |
| JP | 2014-213334 A | 11/2014 |
| JP | 2015-186825 A | 10/2015 |
| KR | 10-2013-0081202 A | 7/2013 |
| TW | I462793 B | 12/2014 |
| WO | WO 2011/018989 A1 | 2/2011 |

PROCESSING DEVICE

TECHNICAL FIELD

One aspect of the present invention relates to a processing device.

BACKGROUND ART

A processing device is conventionally known which forms a modified spot constituting a modified region in an object to be processed. As this type of technology, for example, Patent Literature 1 describes a laser processing device. In the laser processing device described in Patent Literature 1, a modified spot is formed inside an object to be processed by irradiating the object with laser light.

CITATION LIST

Patent Literature

Patent Literature 1: Japanese Unexamined Patent Publication No. 2015-186825

SUMMARY OF INVENTION

Technical Problem

In recent years, as such a processing device is applied to many fields and, a high-value-added processing device is desired which can easily meet various processing requirements (for example, high parting force, damage control on workpiece, compatibility therebetween, or the like).

In view of the foregoing circumstances, an object of one aspect of the present invention is to provide a processing device with high added value.

Solution to Problem

As a result of extensive research, the present inventors found a characteristic phenomenon during a period from the beginning to the end of formation of a modified spot in an object to be processed by irradiation of light. Specifically, when the object is irradiated with light, the absorptivity is temporarily increased in a partial region of the object (for example, near a focal point of the light: hereinafter, also referred to as a "partial region" only) (first stage). By irradiating a partial region where the absorptivity is temporarily increased with light, energy is supplied to the partial region, and the partial region having a high temperature is expanded (second stage). The inventors found a phenomenon that, as a result, a modified spot is formed in the object. The inventors further found that the use of such a characteristic phenomenon makes it possible to easily meet various processing requirements and to increase the added value of the device, leading to the completion of one aspect of the present invention.

To be specific, a processing device according to one aspect of the present invention is a processing device for forming, in an object to be processed, a modified spot constituting a modified region, and the processing device includes a first irradiation unit configured to irradiate the object with first light to temporarily increase absorptivity in a partial region of the object as compared with the absorptivity before irradiation of the first light; and a second irradiation unit configured to irradiate the partial region with second light in an absorptivity increase period in which the absorptivity of the partial region is temporarily increased.

In the processing device, the object is irradiated with the first light to temporarily increase the absorptivity of the partial region in the object, and in the meantime, the partial region is irradiated with the second light to form a modified spot. Thereby, in formation of the modified spot, it is possible to apply the light separately as the first light and the second light in accordance with each phenomenon of the first stage and the second stage. By appropriately changing various parameters or irradiation modes of the first light and the second light, various processing requirements can be easily met. Therefore, a processing device with high added value can be implemented.

In a processing device according to one aspect of the present invention, energy of the second light may be greater than energy of the first light. This enables irradiation of the first light and the second light further in accordance with each phenomenon of the first stage and the second stage.

In a processing device according to one aspect of the present invention, peak intensity of the second light may be lower than peak intensity of the first light. This enables irradiation of the first light and the second light further in accordance with each phenomenon of the first stage and the second stage.

In a processing device according to one aspect of the present invention, a wavelength of the second light may be different from a wavelength of the first light. By appropriately making the wavelength of the first light different from the wavelength of the second light, the absorption of the first light and the second light into the object and the processing result can be controlled.

In a processing device according to one aspect of the present invention, the second light may be light with which no modified spot is formed when being singly applied to the object. In such a case, no modified spot is formed even if the second light is constantly or previously applied, and the first light acts as a trigger for start of the formation of the modified spot. This eliminates the need for precise control of the irradiation timing of the second light.

In a processing device according to one aspect of the present invention, an irradiation direction of the second light with respect to the object may be different from an irradiation direction of the first light with respect to the object. By appropriately making the irradiation direction of the first light and different from the irradiation direction of the second light, the direction in which the modified spot expands at the formation of the modified spot and the position of the modified region can be controlled.

In a processing device according to one aspect of the present invention, an angle at which the second light converges on a condensing position of the second light may be different from an angle at which the first light converges on a condensing position of the first light. By appropriately making the angle at which the first light converges on a condensing position of the first light different from the angle at which the second light converges on a condensing position of the second light, the range of the processing region can be controlled.

In a processing device according to one aspect of the present invention, a beam profile of the second light may be different from a beam profile of the first light. By appropriately making the beam profile of the first light different from the beam profile of the second light, it is possible to control the parting force and damage to the object.

In a processing device according to one aspect of the present invention, an M-squared value of the second light may be different from an M-squared value of the first light. The device can be simplified by appropriately making the M-squared value of the first light different from the M-squared value of the second light.

In a processing device according to one aspect of the present invention, a pulse width of the second light may be different from a pulse width of the first light. By appropriately making the pulse width of the first light different from the pulse width of the second light, the first light and the second light can be applied further in accordance with each phenomenon of the first stage and the second stage.

In a processing device according to one aspect of the present invention, a pulse waveform of the second light may be different from a pulse waveform of the first light. By appropriately making the pulse waveform of the first light different from the pulse waveform of the second light, the first light and the second light can be applied further in accordance with each phenomenon of the first stage and the second stage.

In a processing device according to one aspect of the present invention, a polarization direction of the second light may be different from a polarization direction of the first light. By appropriately making the polarization direction of the first light different from the polarization direction of the second light, the first light and the second light can be applied further in accordance with each phenomenon of the first stage and the second stage.

In a processing device according to one aspect of the present invention, the modified region may be a cutting start region for cutting the object along a thickness direction. In such a case, it is possible to cut the object along the thickness direction with the modified region as a start point of cutting.

In a processing device according to one aspect of the present invention, the modified region may be a cutting start region for cutting the object along a direction intersecting a thickness direction. In such a case, it is possible to cut (slice, for example) the object along a direction intersecting the thickness direction with the modified region as a start point of cutting.

In a processing device according to one aspect of the present invention, the modified region may be a region to be removed that extends two-dimensionally or three-dimensionally in the object. In such a case, the modified region can be selectively removed by etching or the like, and a space extending two-dimensionally or three-dimensionally can be formed in the object.

In a processing device according to one aspect of the present invention, the modified region may be a crystalline region, a recrystallization region, or a gettering region formed inside the object. In such a case, the modified region can be used as the crystalline region, the recrystallization region, or the gettering region.

In a processing device according to one aspect of the present invention, the first irradiation unit may include a first light source configured to emit the first light, and the second irradiation unit may include a second light source configured to emit the second light and a controller configured to control irradiation timing of the second light source so that the second light is applied to the partial region during the absorptivity increase period. In such a case, the processing device according to one aspect of the present invention can be configured using a plurality of light sources.

In a processing device according to one aspect of the present invention, the first irradiation unit and the second irradiation unit may include a light source and an external modulator configured to modulate light emitted from the light source, a part of the light emitted from the light source and modulated by the external modulator may be applied to the object as the first light, and another part of the light emitted from the light source and modulated by the external modulator may be applied to the partial region as the second light during the absorptivity increase period. In such a case, the processing device according to one aspect of the present invention can be configured using the same single light source.

Advantageous Effects of Invention

According to one aspect of the present invention, it is possible to provide a processing device with high added value.

DESCRIPTION OF EMBODIMENTS

Figure 1:
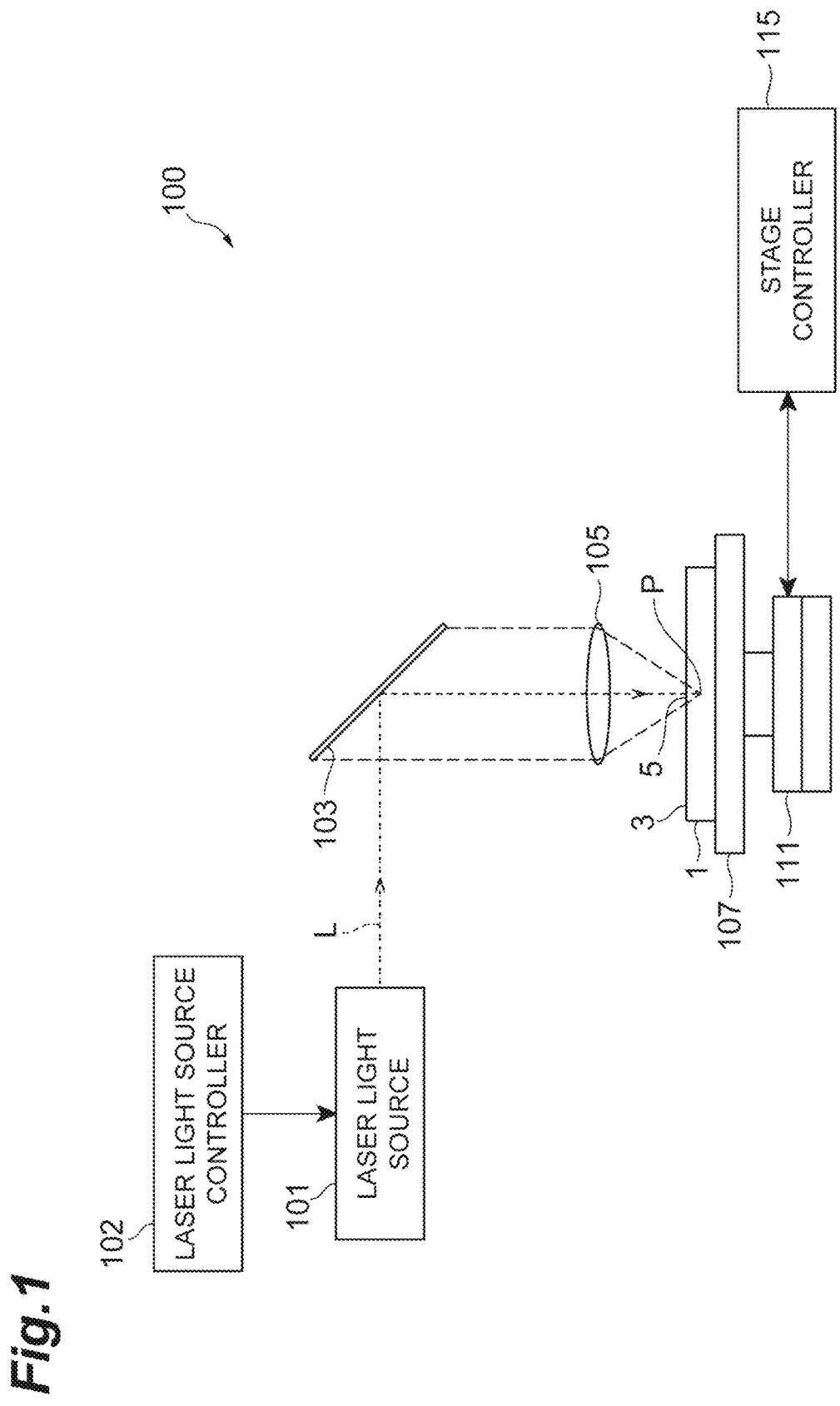
FIG. 1 is a schematic view of the configuration of a laser processing device used for formation of a modified region.

Hereinafter, embodiments are detailed with reference to the drawings. Note that, in each diagram, the same or corresponding parts are denoted by the same reference numerals, and redundant description is omitted.

[Formation of Modified Region]

A processing device according to an embodiment forms a modified spot that constitutes a modified region in an object to be processed by converging light at the object. First, formation of the modified region is described.

A laser processing device 100 shown in FIG. 1 is an example of the processing device, and performs laser processing using thermal stress. The laser processing device 100 converges laser light L at an object to be processed 1 to form a modified region in the object 1 along a line to cut 5. The laser processing device 100 includes a laser light source 101 for causing the laser light L to oscillate in a pulsating manner, a dichroic mirror 103 disposed so as to change, by 90°, the direction of the optical axis (optical path) of the laser light L, and a condenser lens 105 for converging the laser light L. Further, the laser processing device 100 includes a support table 107 for supporting the object 1 irradiated with the laser light L converged by the condenser lens 105, a stage 111 for moving the support table 107, a laser light source controller 102 configured to control the laser light source 101 to adjust the output, pulse width, pulse waveform, and the like of the laser light L, and a stage controller 115 configured to control the movement of the stage 111.

In the laser processing device 100, the dichroic mirror 103 changes, by 90°, the direction of the optical axis of the laser light L emitted from the laser light source 101, and the condenser lens 105 converges the laser light L into the object 1 placed on the support table 107. Along with this, the stage 111 is moved, and the object 1 is moved relatively to the laser light L along the line 5. Thereby, a modified region along the line 5 is formed in the object 1. The stage 111 is moved in order to move the laser light L relatively herein; however, the condenser lens 105 may be moved instead, or both of the stage 111 and the condenser lens 105 may be moved.

Figure 2:
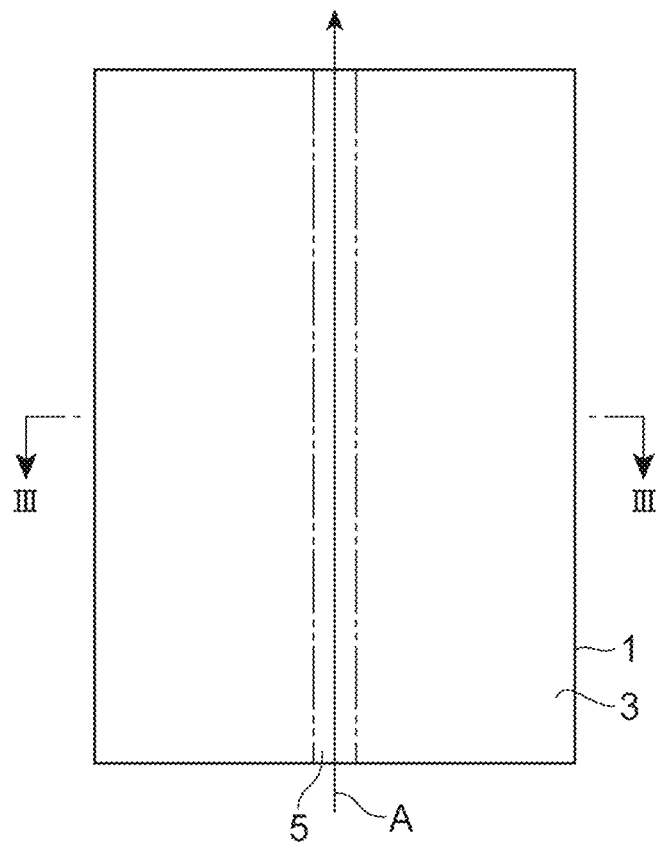
FIG. 2 is a plan view of an object to be processed in which a modified region is to be formed.
Figure 3:
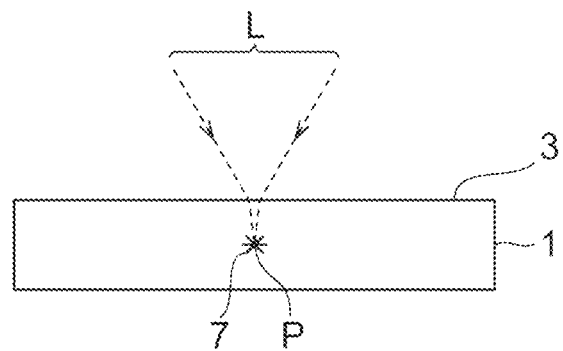
FIG. 3 is a sectional view taken along the line III-III of the object of FIG. 2.
Figure 4:
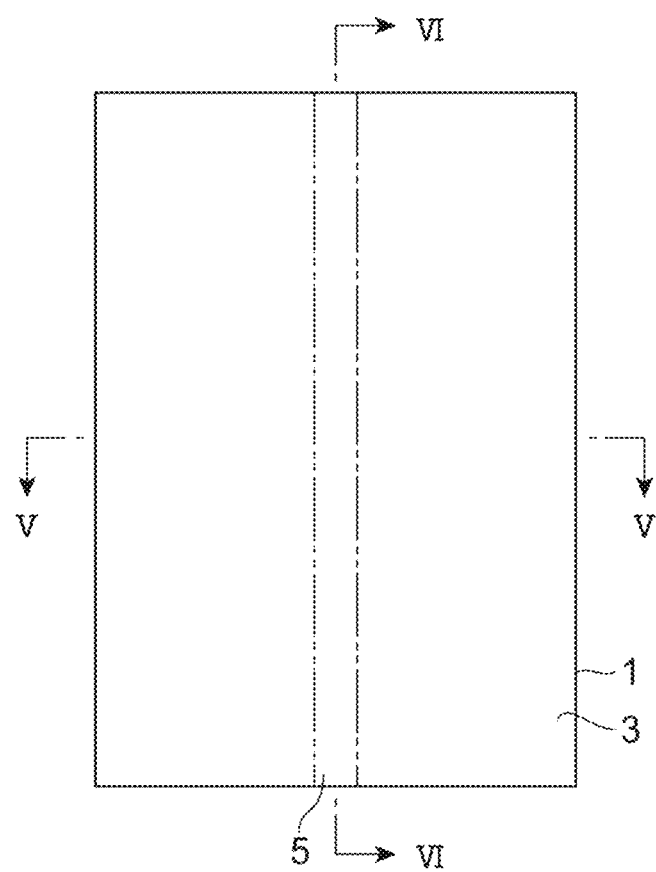
FIG. 4 is a plan view of an object to be processed that has been subjected to laser processing.
Figure 5:
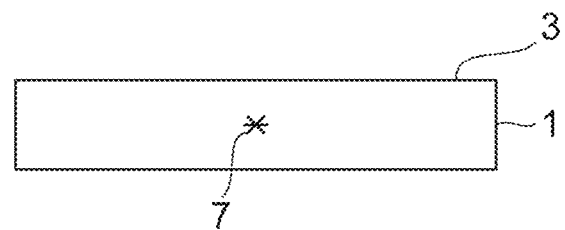
FIG. 5 is a sectional view taken along the line V-V of the object of FIG. 4.
Figure 6:
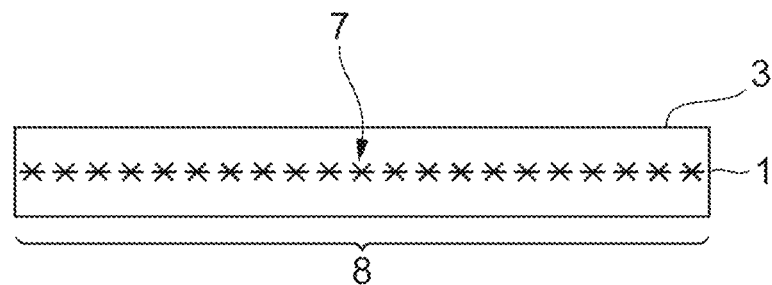
FIG. 6 is a sectional view taken along the line VI-VI of the object of FIG. 4.

As the object 1, a plate-like member (for example, a substrate, a wafer, or the like) including a semiconductor substrate formed of a semiconductor material, a piezoelectric substrate formed of a piezoelectric material, or the like is used. As shown in FIG. 2, the line 5 for cutting the object 1 is set in the object 1. The line 5 is a virtual line extending straight. In the case where a modified region is formed inside the object 1, the laser light L is moved relatively along the line 5 (that is, in the direction of arrow A in FIG. 2) with a focal point (condensing position) P positioned inside the object 1 as shown in FIG. 3. Thereby, as shown in FIGS. 4, 5, and 6, a modified region 7 is formed in the object 1 along the line 5, and the modified region 7 formed along the line 5 becomes a cutting start region 8. By applying an external force to the object 1 in which the modified region 7 as the cutting start region 8 has been formed, or, alternatively, in forming the modified region 7 as the cutting start region 8, the object 1 can be divided into a plurality of chips with the modified region 7 used as a start point for cutting.

The focal point P is a point on which the laser light L converges. The line 5 is not limited to a straight line, but may be a curve, a three-dimensional shape formed by combining these lines, or may be a line in which coordinates are specified. The line 5 is not limited to a virtual line but may be a line actually drawn on a front surface 3 of the object 1. The line 5 is a line to form a modified region. The line to form a modified region is a planned line on which the modified region 7 is to be formed. The modified region 7 is formed continuously in some cases or formed intermittently in other cases. The modified region 7 may be formed in rows or dots, in short, it is only required that the modified region 7 is formed at least within the object 1. In addition, fractures may be formed starting from the modified region 7, and the fractures and the modified region 7 may be exposed to outer surfaces (front surface 3, back surface, or outer peripheral surface) of the object 1. A plane of incidence of laser light in the formation of the modified region 7 is not limited to the front surface 3 of the object 1, and may be the back surface or a side surface of the object 1.

A plurality of functional elements (a light-receiving element such as a photodiode, a light-emitting element such as a laser diode, a circuit element formed as a circuit, and so on) is formed in a matrix on the front surface 3 or the back surface side of the object 1. The plurality of lines 5 are set in a lattice shape so as to pass between the functional elements adjacent to each other.

In the meantime, in the case where the modified region 7 is formed inside the object 1, the laser light L passes through the object 1 and is particularly absorbed near the focal point P positioned within the object 1. Thereby, the modified region 7 is formed in the object 1 (that is, internal absorption type laser processing). In such a case, the front surface 3 of the object 1 hardly absorbs the laser light L; therefore, the front surface 3 of the object 1 does not melt. On the other hand, in the case where the modified region 7 is formed on the front surface 3 of the object 1, the laser light L is particularly absorbed near the focal point P on the front surface 3, and a removed part such as a hole or a groove is formed by melting it away from the front surface 3 (surface absorption type laser processing).

The modified region 7 is a region of which density, refractive index, mechanical strength, and other physical characteristics have attained states different from those of the surrounding regions. Examples of the modified region 7 include a molten processed region (meaning at least one of a region resolidified after having been once molten, a region in the molten state, and a region in the process of resolidifying from the molten state), a crack region, a dielectric breakdown region, a refractive index changed region, and their mixed region. Other examples of the modified region 7 include a region where the density of the modified region 7 has changed from that of an unmodified region and a region formed with a lattice defect in a material of the object 1. In the case where the material of the object 1 is single crystal silicon, the modified region 7 can be said to be a high transitional density region.

The molten processed region, the refractive index change region, the region where the modified region 7 has a density different from that of the unmodified region, and the region formed with a lattice defect may further contain fractures (cuts, microcracks) therewithin or at an interface between the modified region 7 and the unmodified region. The fractures contained are sometimes extended in the entire surface of the modified region 7, or sometimes formed in only one part or a plurality of parts. The object 1 includes a substrate made of a crystal material having a crystal structure. For example, the object 1 includes a substrate made of at least one of gallium nitride (GaN), silicon (Si), silicon carbide (SiC), $LiTaO_3$, diamond, GaOx, and sapphire ($Al_2O_3$). In other words, the object 1 includes, for example, a gallium nitride substrate, a silicon substrate, a SiC substrate, a $LiTaO_3$ substrate, a diamond substrate, a GaOx substrate, or a sapphire substrate. The crystal material may be either an anisotropic crystal or an isotropic crystal. The object 1 may include a substrate made of an amorphous material having an amorphous structure (amorphous structure), and may include, for example, a glass substrate.

In the embodiments, the modified region 7 can be formed by forming one or more modified spots (processing scars, modified layers). In such a case, one modified spot or a group of modified spots becomes the modified region 7. The modified spot is one or more modified parts included in the modified region 7. The modified spot is a modified part constituting the modified region 7. The modified spot is a spot-like modified part. At least some of the plurality of modified spots may be spaced from one another or may be in contact (continuous) with one another. The modified spot is a modified part formed by a shot of one pulse of pulsed laser light (that is, one pulse of laser irradiation: laser shot). Herein, the modified spot is a modified part formed in response to a shot of one pulse of first laser light described later. Examples of the modified spot include a crack spot, a molten processed spot, a refractive index changed spot, and a mixture of at least one of these spots. As for the modified spot, the size and length of fractures occurring therefrom can be controlled as necessary in view of the required cutting accuracy, the demanded flatness of cut surfaces, the thickness, the kind, and the crystal orientation of the object 1, and the like. In the embodiments, the modified spot can be formed as the modified region 7 along the line 5. The modified spot is not limited to a local spot or a spot in dots. The size and shape of the modified spot are not particularly limited, and may be various sizes and shapes.

[Mechanism for Forming Modified Spot]

In forming a modified spot in the object 1, a characteristic phenomenon for each stage is found during a period from the beginning to the end of the formation of a modified spot. Hereinafter, the mechanism for forming a modified spot is described.

Figure 7:
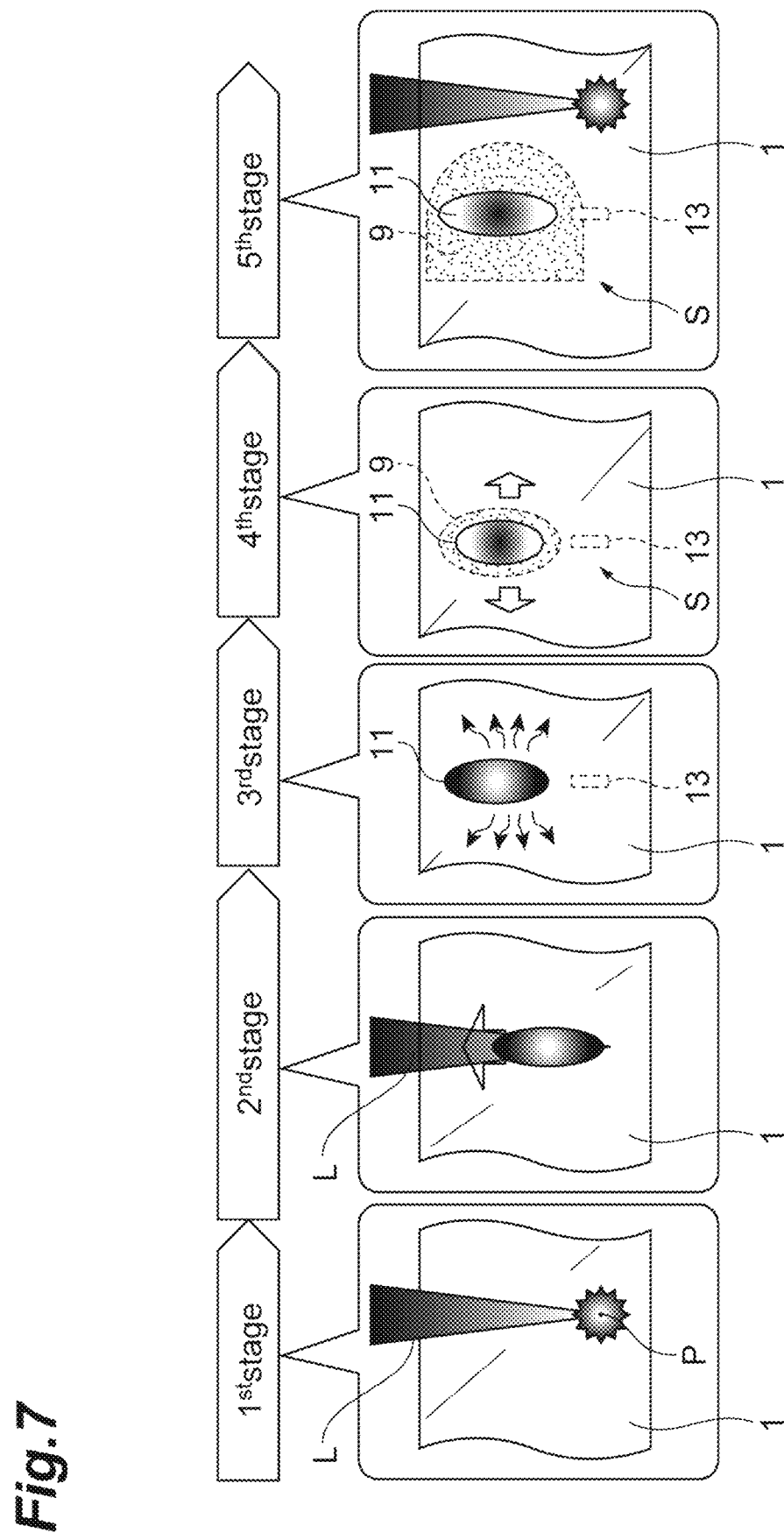
FIG. 7 is a diagram for explaining a mechanism for forming a modified spot.

As shown in FIG. 7, the phenomenon from the start to completion of the formation of the modified spot S can be divided into five stages according to the content of the phenomenon. In this example, it is supposed that the object 1 is silicon.

The first stage is a period immediately after a pulse of the laser light L is applied to the object 1. In the first stage, in the object 1, initial absorption occurs around the room temperature and the temperature rises locally and plasma is generated in a partial region near the focal point (a partial region including the focal point: hereinafter, also referred to as a "partial region" simply), and the absorptivity temporarily rises in the partial region. The end point of the first stage is a point of time up to 1 ps for the case of nonlinear absorption, which is a nonlinear absorption phenomenon such as multiphoton absorption, and is a point of time up to 1 ms for the case of linear absorption which is a normal absorption phenomenon, starting from the start of irradiation of the laser light L on the object 1. The object 1 for the first stage has a temperature of, for example, several 10000K. The object 1 for the first stage has a plasma, vapor or liquid state. As for such laser light L for the first stage, at least one of good convergence properties, transmission properties to the focal point, selective absorbing properties at the focal point, a high peak power, and a steep rising pulse waveform is desired.

The second stage is a period in which the local temperature rise advances and the partial region where the absorptivity has increased expands. The second stage is a period in which the laser light L is applied. In the second stage, energy is supplied to the partial region of the object 1 in a high temperature state (high temperature region), the high temperature region expands upward (irradiation side of the laser light L), and a region in which to form a modified spot is defined. The end point of the second stage is a point of time up to, for example, 700 ns starting from the start of irradiation of the laser light L on the object 1. The object 1 for the second stage has a temperature of, for example, 2000 to 10000K. The object 1 for the second stage has a liquid state. In the second stage, the high temperature region is a molten region. As for such laser light L for the second stage, it is important that the laser light L has a pulse waveform or a wavelength not absorbed by the object 1 before processing near the room temperature. As for the laser light L for the second stage, at least one of a propagation profile according to processing requirements (processing purpose), a large pulse energy, and a duration is desired.

The third stage is a period in which the temperature rapidly decreases due to conduction cooling, a void 13 is fixed, and the molten region is confined (a molten solidified region 11 is formed). The third stage is a period immediately after irradiation of the laser light L is stopped. The end point of the third stage is, for example, a point of time up to 2 µs starting from the start of irradiation of the laser light L on the object 1. The object 1 for the third stage has a temperature of, for example, 500 to 2000K. The object 1 for the third stage has a solid state. In such a third stage, at least one of rapid conduction cooling, solidification preceding near the focal point (fixing of the void 13), and confinement of a melt in a shape and large volume suitable for parting is desired. The fixing of the void 13 is not limited to being made in the third stage, and may be made in the second stage.

The fourth stage is a period in which the entirety is solidified due to further thermal diffusion, a large stress St is generated from the region that has been molten to the end, a residual stress field is formed, and microcracks are generated and expanded. In the illustrated example, the generated and expanded microcracks form a microcrack group 9. The microcrack group 9 is a microcrack aggregate. The fourth stage is a period in which the irradiation of the laser light L is stopped. In the fourth stage, a dislocation region is formed. The end point of the fourth stage is, for example, a point of time up to 10 µs starting from the start of irradiation of the laser light L on the object 1. The object 1 for the fourth stage has a temperature equal to the room temperature or so. The object 1 for the fourth stage has a solid state. In such a fourth stage, at least one of a solidification order and speed suitable for parting, dislocation, and formation of a high-pressure region (control of residual stress distribution) is desired.

The fifth stage is a period in which the object 1 is irradiated with the next pulse of the laser light L, and is similar to the first stage. In the fifth stage, in the modified spot S that has been formed in the first to fourth stages so far, the microcracks are developed and the microcrack group 9 is expanded.

Figure 8:
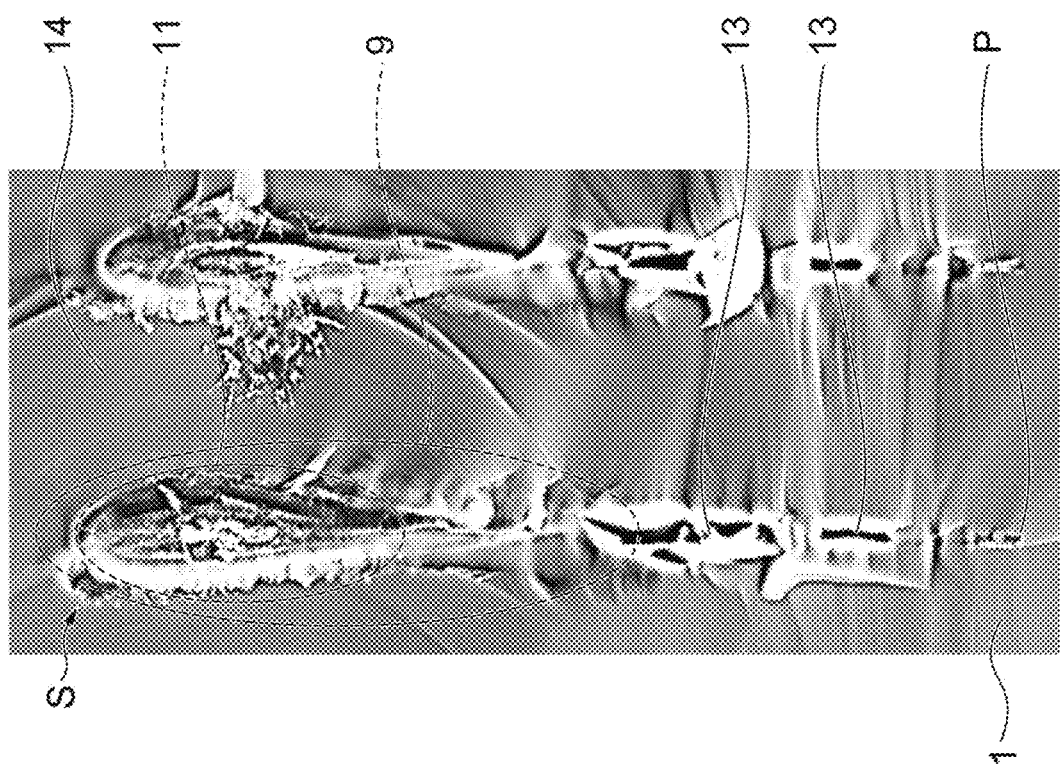
FIG. 8 is a photograph showing a cross section of an object to be processed in which a modified spot has been formed.

FIG. 8 is a photograph showing a cross section of the object 1 in which the modified spot S has been formed. The state of the picture corresponds to the state of the fifth stage. The upper side of the picture shows the irradiation side of the laser light L. As shown in FIG. 8, the modified spot S includes a molten solidified region 11, the microcrack group 9, and the void 13. The molten solidified region 11 is a region that has been molten to the end in resolidification from the third stage to the fourth stage. A large stress is produced by volume expansion in the resolidification of the molten solidified region 11. A crack 14 is generated due to the stress centered on the molten solidified region 11. The microcrack group 9 is formed by the stress associated with the resolidification from the third stage to the fourth stage. The microcrack group 9 is sometimes accompanied by high-density dislocation. The microcrack group 9 gathers and grows to become the crack 14. The void 13 is a cavity left behind in the resolidification after melting and evaporation in the second stage. The focal point P in the figure is the start point of processing and is an action region in the first stage.

First Embodiment

Next, a laser processing device according to the first embodiment is described.

Figure 9:
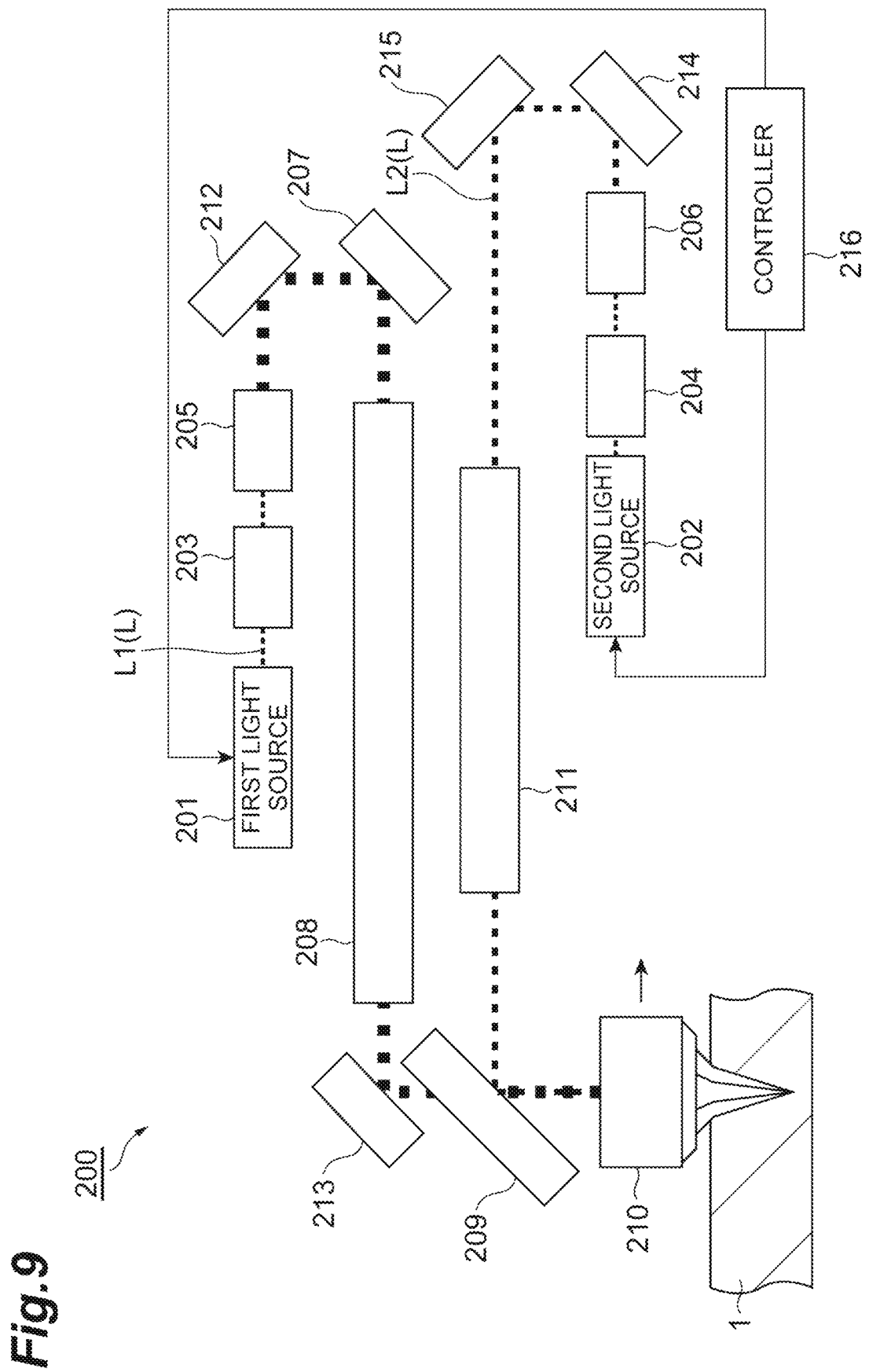
FIG. 9 is a schematic view showing the configuration of a laser processing device according to a first embodiment.

A laser processing device 200 according to the first embodiment shown in FIG. 9 is a device having specifications in which the parting force is given priority, and the laser processing device 200 is capable of cutting the object 1 along the thickness direction with a high parting force. The laser processing device 200 includes a first light source 201, a second light source 202, a first attenuator 203, a second attenuator 204, a first beam expander 205, a second beam expander 206, a spatial light modulator 207, a relay optical system 208, a dichroic mirror 209, a condensing optical system 210, and a cylindrical lens unit 211.

The first light source 201 emits first laser light (first light) L1 of pulsed laser light (causes the first laser light (first light) L1 to oscillate in a pulsating manner). As an example, the first light source 201 emits the first laser light L1 having a wavelength of 1064 nm and a pulse duration of 30 ns. The second light source 202 emits second laser light (second light) L2 of pulsed laser light (causes the second laser light (second light) L2 to oscillate in a pulsating manner). As an example, the second light source 202 emits the second laser light L2 having a wavelength of 1550 nm and a pulse duration of 1000 ns. Each of the first laser light L1 and the second laser light L2 corresponds to the laser light L described above.

The first attenuator 203 adjusts the output (light intensity) and the polarization direction of the first laser light L1 emitted from the first light source 201. The second attenuator 204 adjusts the output and the polarization direction of the second laser light L2 emitted from the second light source 202. The first beam expander 205 adjusts the beam diameter and the angle of divergence of the first laser light L1 that has passed through the first attenuator 203. The second beam expander 206 adjusts the beam diameter and the angle of divergence of the second laser light L2 that has passed through the second attenuator 204.

The spatial light modulator 207 modulates and reflects the first laser light L1 that has passed through the first beam expander 205 and been reflected from the mirror 212. The spatial light modulator 207 is, for example, a spatial light modulator (SLM) of a reflective liquid crystal (liquid crystal on silicon (LCOS)). The spatial light modulator 207 includes a display unit that the first laser light L1 enters, and modulates the reflected first laser light L1 (for example, modulates the intensity, amplitude, phase, polarization, and so on of the first laser light L1) by appropriately setting a modulation pattern displayed on the display unit.

The relay optical system 208 transfers (forms), on the entrance pupil plane of the condensing optical system 210, an image of the first laser light L1 (an image of the first laser light L1 modulated by the spatial light modulator 207) on the display unit of the spatial light modulator 207. Examples of the relay optical system 208 include a 4f lens unit.

The dichroic mirror 209 transmits the first laser light L1, which has passed through the relay optical system 208 and been reflected from the mirror 213, toward the condensing optical system 210, and reflects the second laser light L2 that has passed through the cylindrical lens unit 211 toward the condensing optical system 210.

The condensing optical system 210 converges the first laser light L1 and the second laser light L2 at the object 1. The condensing optical system 210 includes a plurality of lenses and a holder for holding the plurality of lenses. The condensing optical system 210 can move along the direction of the optical axis thereof with a driving force of a drive mechanism such as a piezoelectric element.

The cylindrical lens unit 211 adjusts (shape a beam) a beam profile of the second laser light L2 that has passed through the second beam expander 206 and been reflected from the mirrors 214 and 215. The cylindrical lens unit 211 makes the beam profile of the second laser light L2 applied to the object 1 long in the direction along the line 5.

A controller 216 includes a central processing unit (CPU), a read only memory (ROM), and a random access memory (RAM). The controller 216 controls the operation of each unit of the laser processing device 200. The controller 216 has the functions of the laser light source controller 102 and the stage controller 115 (see FIG. 1) described above. The controller 216 controls the operation of the first light source 201 and the second light source 202 to emit the first laser light L1 and the second laser light L2 from the first light source 201 and the second light source 202, respectively. The controller 216 adjusts the output, pulse width, and so on of the first laser light L1 and the second laser light L2 emitted from the first light source 201 and the second light source 202, respectively. In forming the modified spot S, the controller 216 controls the operation of each unit of the laser processing device 200 so that the focal points of the first laser light L1 and the second laser light L2 are positioned at a predetermined depth and move relatively along the line 5. The controller 216 adjusts the timing at which the first laser light L1 and the second laser light L2 are emitted from the first light source 201 and the second light source 202 to control the timing at which the first laser light L1 and the second laser light L2 arrive at a processing point.

In forming the modified spot S, the controller 216 displays a predetermined modulation pattern on the display unit of the spatial light modulator 207 and modulates, as desired, the first laser light L1 with the spatial light modulator 207. The modulation pattern to be displayed is derived in advance on the basis of a depth position where the modified spot S is to be formed, the wavelength of the first laser light L1, the material of the object 1, the refractive index of the condensing optical system 210 and the object 1, and so on, and the modulation pattern to be displayed is stored in the controller 216. The modulation pattern may include at least one of an individual difference correction pattern for correcting individual differences occurring in the laser processing device 200, a spherical aberration correction pattern for correcting a spherical aberration, an astigmatism correction pattern for correcting astigmatism, and so on.

The controller 216 controls the first light source 201 to emit the first laser light L1, and then controls the second light source 202 to emit the second laser light L2. Specifically, the controller 216 controls the first light source 201 to irradiate the object 1 with the first laser light L1 by one pulse, and controls the second light source 202 to irradiate the object 1 with the second laser light L2 by one pulse in an absorptivity increase period in which the absorptivity temporarily increases in a partial region of the object 1. The controller 216 stops the emission from the first light source 201 and the second light source 202 for a certain period after the irradiation of the second laser light L2 by one pulse. Thereafter, the controller 216 repeats the irradiation of the first laser light L1 and the second laser light L2 by one pulse.

The partial region is, for example, a region near the focal point of the first laser light L1 in which the absorptivity increases in association with the irradiation and convergence of the first laser light L1. The absorptivity is a rate of absorption of the first laser light L1 and the second laser light L2 per unit length (per 1 cm, for example). The absorptivity increase period is a period in which the absorptivity temporarily rises (the absorptivity is temporarily increased) with reference to the absorptivity before irradiation of the first laser light L1. The absorptivity increase period includes, in a range where the absorptivity is large as compared with that before irradiation of the first laser light L1, a period in which the absorptivity increases and a period in which the absorptivity decreases. For example, in the absorptivity increase period, the absorptivity decreases after increasing with time in the range where the absorptivity is large as compared with that before irradiation of the first laser light L1.

Figure 10:
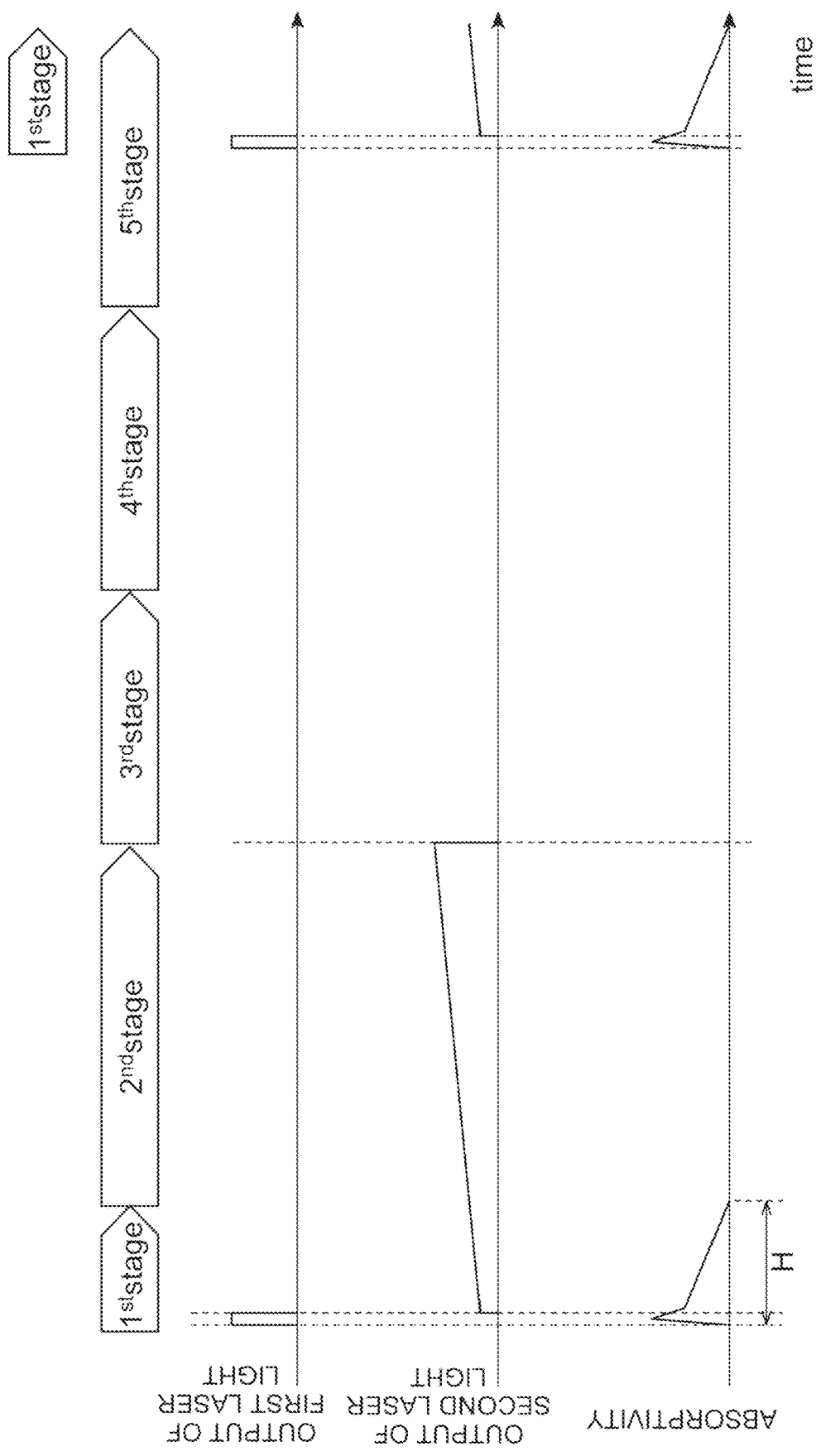
FIG. 10 is a diagram for explaining first laser light, second laser light, and absorptivity.

More specifically, the controller 216 controls the irradiation timing of the first laser light L1 and the second laser light L2 in the following manner. To be specific, as shown in FIG. 10, first, the first laser light L1 by one pulse is applied. Thereby, the first stage starts, the absorptivity of the partial region increases steeply, peaks, and declines. During an absorptivity increase period H, the second laser light L2 by one pulse is applied. In the illustrated example, the pulse of the second laser light L2 rises at the end of the pulse of the first laser light L1. The pulse of the second laser light L2 is maintained for a predetermined period and ends. The irradiation of the second laser light L2 increases or maintains the absorptivity. Along with the end, the second stage finishes and the third stage starts. The irradiation of the first laser light L1 and the second laser light L2 stops for a certain period of time, and thereby the third stage and the fourth stage progress.

In the laser processing device 200 configured as described above, a processing method is carried out which includes a step of irradiating the object 1 with the first laser light L1 to temporarily increase the absorptivity in a partial region of the object 1 as compared with that before the irradiation of the first laser light L1 and a step of irradiating the partial region with the second laser light L2 in the absorptivity increase period H in which the absorptivity of the partial region temporarily increases.

Here, detailed descriptions are provided below of the characteristics of the first laser light L1 and the second laser light L2 applied to the object 1 in the laser processing device 200.

The energy of the second laser light L2 is higher than the energy of the first laser light L1. The energy herein is the total amount of energy supplied in the entire time axis. The peak intensity of the second laser light L2 is lower than the peak intensity of the first laser light L1. The peak intensity herein is energy per unit area and unit time in a region where the laser light L is absorbed. The energy and peak intensity of the first laser light L1 can be controlled by at least one of the first light source 201 and the first attenuator 203, for example. The energy and peak intensity of the second laser light L2 can be controlled by at least one of the second light source 202 and the second attenuator 204, for example. The energy and peak intensity of the first laser light L1 and the second laser light L2 can also be controlled using a modulator such as an electro-optic modulator (EOM) or an acousto-optic modulator (AOM).

The wavelength of the second laser light L2 is different from the wavelength of the first laser light L1. The wavelength of the second laser light L2 and the wavelength of the second laser light L2 are wavelengths with which the second laser light L2 passes through the object 1, and are 1000 to 8500 nm with which the second laser light L2 passes through silicon. The wavelength of the second laser light L2 is longer than the wavelength of the first laser light L1. In the case where the object 1 is silicon and the wavelength is 1000 nm or more and less than 1100 nm, the absorption into the object 1 is quick, damage is small, and fractures are difficult to expand. In the case where the object 1 is silicon and the wavelength is 1100 nm or more and less than 2000 nm, the parting force increases, and the parting force can be given priority (make fractures to be generated longer) over damage control to the object 1. In the case where the object 1 is silicon and the wavelength is 2000 nm or more and less than 8500 nm, the parting force further increases, and the parting force can be given further priority over damage control to the object 1. The wavelength of the first laser light L1 can be controlled by at least one of the first light source 201 and the spatial light modulator 207, for example. The wavelength of the second laser light L2 can be controlled by the second light source 202, for example. The wavelengths of the first laser light L1 and the second laser light L2 can be controlled using a modulator such as the EOM or the AOM.

The second laser light L2 is laser light with which no modified spot S and thus no modified region 7 are formed when the second laser light L2 is singly applied to the object 1. For example, the peak intensity of the second laser light L2 is lower than the processing threshold value of the object 1, and formation of the modified spot S is not started singly. In such a case, the second laser light L2 may be applied to the object 1 constantly or in advance, and only the first laser light L1 acts as a trigger for start of the processing. At this time, the second laser light L2 before start of the processing is not absorbed into the object 1 and becomes passing light. The "passing light" is light that enters from one side of the object 1 and exits (emits) from the other side without being absorbed into the object 1. The damage caused by the passing light to the surface opposite to the plane of incidence of the light is also referred to as "back surface damage".

The numerical aperture (NA) of the second laser light L2 is different from the NA of the first laser light L1. The NA of the first laser light L1 is an angle at which the first laser light L1 converges on the condensing position of the first laser light L1. The NA of the second laser light L2 is an angle at which the second laser light L2 converges on the condensing position of the second laser light L2. Specifically, the NA of the second laser light L2 is smaller than the NA of the first laser light L1. The second laser light L2 may be a parallel beam.

The NA of the first laser light L1 can be controlled by at least one of the first beam expander 205, the spatial light modulator 207, and the condensing optical system 210, for example. The NA of the second laser light L2 can be controlled by at least one of the second beam expander 206 and the condensing optical system 210, for example. In short, the NA of the laser light L can be controlled by at least one of a finite aperture such as an objective lens or a pinhole, a beam adjustment system such as a beam expander, and a spatial light modulator. The NA has a tendency that the higher the value is, the smaller the spot size at the focal point is, and the beam diameter increases rapidly away from the focal point. The NA is determined depending on the diameter of the laser light L in the condensing optical system 210 and the focal length of the condensing optical system 210. The position dependency of the peak intensity of the laser light L increases with increasing the NA. In the case where the laser light L is locally focused in the depth direction (the direction of optical axis, the thickness direction), it is advantageous that the NA is high. On the other hand, in the case where the laser light L is distributed in a long region along the direction of optical axis, a lower NA is advantageous.

The beam profile of the second laser light L2 is different from the beam profile of the first laser light L1. Specifically, the beam profile of the first laser light L1 has a rotational symmetry such as a perfect circle or a ring. The beam profile of the second laser light L2 has an elongated shape along the line 5. The beam profile of the second laser light L2 has a rotationally asymmetric shape (for example, an oval, an ellipse, a rectangle, or a polygon) with a direction along the line 5 as the longitudinal direction. The beam profile of the first laser light L1 can be controlled by the spatial light modulator 207. The beam profile of the second laser light L2 can be controlled by the cylindrical lens unit 211. The beam profile may be controlled using, for example, a diffractive optical element (DOE) or a spatial light modulator, and in such a case, a complicated beam profile such as an oval or a polygon can be easily obtained.

An M-squared value of the second laser light L2 is different from an M-squared value of the first laser light L1. The M-squared value is a value indicating the quality of the laser light L (the transverse mode of the laser light L). The M-squared value is a value representing the convergence properties of the laser light L. The M-squared value is also expressed as M^2. The M-squared value indicates how far the actual laser light L is away from an ideal Gaussian laser light of TEM00 (fundamental mode light). The M-squared value is the product of the angle of divergence of the actual laser light L and the beam waist diameter with respect to the product of the angle of divergence of the Gaussian laser light of TEM00 and the beam waist diameter.

The M-squared value of the second laser light L2 is larger than the M-squared value of the first laser light L1. The first laser light L1 needs a good beam quality, and the M-squared value of the first laser light L1 is 1.5 or less. The second laser light L2 does not need the same beam quality as that of the first laser light L1, and the M-squared value of the second laser light L2 is 6.0 or less. The M-squared value of the first laser light L1 can be controlled by at least one of the first light source 201 and the spatial light modulator 207, for example. The M-squared value of the second laser light L2 can be controlled by the second light source 202, for example. The M-squared value of the laser light L may be controlled by using at least one of the laser light source of that laser light L, a spatial filter, and the spatial light modulator.

The pulse width of the second laser light L2 is different from the pulse width of the first laser light L1. The pulse width of the second laser light L2 is longer than the pulse width of the first laser light L1. The pulse width of the first laser light L1 can be controlled by the first light source 201, for example. The pulse width of the second laser light L2 can be controlled by the second light source 202, for example. The pulse widths of the first laser light L1 and the second laser light L2 can also be controlled using a modulator such as the EOM or the AOM.

The pulse waveform of the second laser light L2 is different from the pulse waveform of the first laser light L1. The pulse waveform of the first laser light L1 is a rectangular waveform or a Gaussian waveform. The pulse waveform of the second laser light L2 is a waveform having a higher output over time, and specifically, is a waveform in which the output is increased so that the peak intensity becomes constant in response to increase in the effective area where the second laser light L2 is absorbed in an absorption region (hereinafter such a waveform is referred to simply as "backward rise waveform"). The pulse waveform of the second laser light L2 has, for example, a square curve. The pulse waveform of the first laser light L1 can be controlled by the first light source 201, for example. The pulse waveform of the second laser light L2 can be controlled by the second light source 202, for example. The pulse waveforms of the first laser light L1 and the second laser light L2 can also be controlled using a modulator such as the EOM or the AOM.

The polarization direction of the second laser light L2 is different from the polarization direction of the first laser light L1. The polarization direction of the first laser light L1 is vertical, horizontal, clockwise circular polarization, counterclockwise circular polarization, or Z-polarization. The polarization direction of the second laser light L2 is horizontal, vertical, counterclockwise circular polarization, clockwise circular polarization, or Z-polarization. The polarization direction of the first laser light L1 can be controlled by, for example, at least one of a wave plate (not shown) and the spatial light modulator 207. The polarization direction of the second laser light L2 can be controlled by, for example, a wave plate (not shown). Polarization includes, for example, linear polarization, orthogonal polarization, circular polarization, random polarization, Z-polarization, and radial polarization. The wave plate includes at least one of a quarter-wave plate, a half-wave plate, and a Z-wave plate. The polarization directions of the first laser light L1 and the second laser light L2 can also be controlled using at least one of a wave plate, a depolarizer, and a spatial light modulator.

In the laser processing device 200, the first laser light L1 necessary and sufficient for the first stage can be supplied with a temporal and spatial distribution optimum for the first stage. After an appropriate time interval, the second laser light L2 necessary and sufficient for the second stage can be supplied with a temporal and spatial distribution optimum for the second stage. Thereafter, the second laser light L2 (and other light) can be blocked sharply so that cooling is performed promptly in the third stage and beyond.

The laser processing device 200 herein is configured to have the following characteristics with respect to the first laser light L1 and the second laser light L2 applied to the object 1.

(Wavelength)
First laser light L1: 1026 to 1064 nm
Second laser light L2: 1180 to 7500 nm (Beam Quality (M-Squared Value))
First laser light L1: 1.0
Second laser light L2: less than 3.0
(Pulse Duration)
First laser light L1: 20 to 50 ns
Second laser light L2: 0.7 to 5 μs
(Pulse Rise Time)
First laser light L1: less than 5 ns
Second laser light L2: less than 50 ns
(Pulse Waveform)
First laser light L1: rectangular waveform or Gaussian waveform
Second laser light L2: backward rise waveform (square curve)
(Peak Intensity)
First laser light L1: 70 W
Second laser light L2: 150 to 250 W
(Repetition Frequency)
First laser light L1: 150 kHz or less
Second laser light L2: 150 kHz or less
(Irradiation Timing)
First laser light L1: arbitrary
Second laser light L2: 20 to 30 ns later (starting from the start of irradiation of the first laser light L1)
(Condensing System)
First laser light L1: convergence given priority
Second laser light L2: path given priority
(Aberration Correction)
First laser light L1: yes
Second laser light L2: none
(Symmetry of Beam Profile)
First laser light L1: rotational symmetry (perfect circle)
Second laser light L2: long in the direction along the line 5
(NA)
First laser light L1: 0.7 or more
Second laser light L2: 0.2 to 0.6

As described above, in formation of the modified spot S, the laser processing device 200 can apply the first laser light L1 and the second laser light L2 separately in accordance with each phenomenon of the first stage and the second stage. By appropriately changing various parameters or irradiation modes of the first laser light L1 and the second laser light L2, various processing requirements can be easily met. Therefore, the laser processing device 200 with high added value can be implemented. In addition, it is possible to improve the parting force using a simple and inexpensive optical system.

In the laser processing device 200, the energy of the second laser light L2 is higher than the energy of the first laser light L1. This enables irradiation of the first laser light L1 and the second laser light L2 further in accordance with each phenomenon of the first stage and the second stage.

In the laser processing device 200, the peak intensity of the second laser light L2 is lower than the peak intensity of the first laser light L1. This enables irradiation of the first laser light L1 and the second laser light L2 further in accordance with each phenomenon of the first stage and the second stage.

In the laser processing device 200, the wavelength of the second laser light L2 is different from the wavelength of the first laser light L1. By appropriately making the wavelength of the first laser light L1 different from the wavelength of the second laser light L2, the absorption of the first laser light L1 and the second laser light L2 into the object 1 and the processing result can be controlled. Further, the object 1 that is a semiconductor has spectral absorption characteristics greatly changing near the band gap; therefore, changing the wavelength enables effective control over the absorption distribution and processing result. In particular, in the laser processing device 200, the wavelength of the second laser light L2 is longer than the wavelength of the first laser light L1. Thereby, it is possible to increase the parting force with the second laser light L2 while accelerating the absorption of the first laser light L1 and suppressing the damage (simultaneous achievement of high parting force and damage control).

In the laser processing device 200, the second laser light L2 is light with which no modified spot S is formed when being singly applied to the object 1. In view of this, the second laser light L2 may be applied constantly or in advance, and even in such a case, no modified spot S is formed, and the first laser light L1 serves as a trigger for starting the formation of the modified spot S. This eliminates the need for precise control on the irradiation timing of the second laser light L2.

In the laser processing device 200, the NA of the second laser light L2 is different from the NA of the first laser light L1. By appropriately making the NA of the first laser light L1 different from the NA of the second laser light L2, the range of the processing region can be controlled. In particular, in the laser processing device 200, the NA of the second laser light L2 is smaller than the NA of the first laser light L1. Thereby, since the divergence of the beam of the second laser light L2 is controlled even at a position away from the focal point, the modified spot S can be guided or formed to a position away from the focal point.

In the laser processing device 200, the beam profile of the second laser light L2 is different from the beam profile of the first laser light L1. By appropriately making the beam profile of the first laser light L1 different from the beam profile of the second laser light L2, it is possible to control the parting force and damage to the object 1. In particular, in the laser processing device 200, the beam profile of the first laser light L1 has a rotationally symmetric shape, which enables the first laser light L1 to be converged at a small region, leading to a high power density. Therefore, the phenomenon of the first stage can be implemented with minimum leakage light. The beam profile of the second laser light L2 has an elongated shape along the line 5. This enables the object 1 to be easily cut along the line 5. Further, since the direction orthogonal to the line 5 when viewed from the thickness direction is the shorter direction of the beam profile of the second laser light L2, the adverse effect of the second laser light L2 on the functional element of the object 1 can be suppressed.

In the laser processing device 200, the M-squared value of the second laser light L2 is different from the M-squared value of the first laser light L1. By appropriately making the M-squared value of the first laser light L1 different from the M-squared value of the second laser light L2, the device can be less complicated, reduced in price, and simplified. In particular, in the laser processing device 200, the M-squared value of the first laser light L1 is smaller than the M-squared value of the second laser light L2. This enables reduction in limitations on the beam quality of the second laser light L2 while the beam quality required for the first laser light L1 is ensured.

In the laser processing device 200, the pulse width of the second laser light L2 is different from the pulse width of the first light. By appropriately making the pulse width of the first laser light L1 different from the pulse width of the second laser light L2, the first laser light L1 and the second laser light L2 can be applied further in accordance with each phenomenon of the first stage and the second stage. In particular, in the laser processing device 200, the pulse width of the first laser light L1 is longer than the pulse width of the second laser light L2. Thereby, energy by the second laser light L2 is supplied more appropriately according to the rate at which the molten region can be grown or according to the time necessary for the molten region to be grown, so that a more appropriate molten region, further, modified spot S can be formed.

In the laser processing device 200, the pulse waveform of the second laser light L2 is different from the pulse waveform of the first laser light L1. By appropriately making the pulse waveform of the first laser light L1 different from the pulse waveform of the second laser light L2, the first laser light L1 and the second laser light L2 can be applied further in accordance with each phenomenon of the first stage and the second stage. In particular, in the laser processing device 200, the pulse waveform of the first laser light L1 is a rectangular waveform or a Gaussian waveform; thereby the pulse waveform has sharp rise characteristics, which minimizes the leakage light before processing. The pulse waveform of the second laser light L2 is a backward rise waveform, so that even when the area of the absorption region of the second laser light L2 increases, the peak intensity can be kept constant accordingly.

In the laser processing device 200, the polarization direction of the second laser light L2 is different from the polarization direction of the first laser light L1. By appropriately making the polarization direction of the first laser light L1 different from the polarization direction of the second laser light L2, the first laser light L1 and the second laser light L2 can be applied further in accordance with each phenomenon of the first stage and the second stage. The first laser light L1 and the second laser light L2 can be easily combined and separated. In particular, in the laser processing device 200, the polarization direction of the first laser light L1 is vertical, horizontal, clockwise circular polarization, counterclockwise circular polarization, or Z-polarization, and the polarization direction of the second laser light L2 is horizontal, vertical, counterclockwise circular polarization, clockwise circular polarization, or Z-polarization. As a result, even when the wavelength of the first laser light L1 is the same as the wavelength of the second laser light L2, it is possible to easily perform beam synthesis to the same optical path or beam separation from the same optical path using the difference in polarization direction. Further, by using the Z-polarized laser light L having a high transmittance into the substance, the internal processing can be performed more appropriately on the object 1.

In the laser processing device 200, the modified region 7 is a cutting start region for cutting the object 1 along the thickness direction. This enables the object 1 to be cut (divided) along the thickness direction with the modified region 7 as a start point of cutting.

The laser processing device 200 includes the first light source 201, the second light source 202, and the controller 216. The laser processing device 200 that irradiates the object 1 with the first laser light L1 and the second laser light L2 can be configured using the first light source 201 and the second light source 202 (plurality of light sources).

In the laser processing device 200, the irradiation direction of the second laser light L2 with respect to the object 1 is the same as the irradiation direction of the first laser light L1 with respect to the object 1. In such a case, the first laser light L1 and the second laser light L2 can be irradiated from the same direction, which simplifies the optical system.

Note that the irradiation direction of the first laser light L1 and the irradiation direction of the second laser light L2 may be set as appropriate from the viewpoint of the processing purpose and the limitation on the device configuration. Regardless of whether the focal points of the first laser light L1 and the second laser light L2 are common or different, it is possible to characterize the processing by controlling the irradiation directions (propagation directions) separately. For example, as shown in a modification example described later, the first laser light L1 may be made incident vertically from the front surface (or back surface) of the object 1 while the second laser light L2 may be made incident from the back surface (or front surface), from side, from the direction opposite thereto, or from a combination direction thereof. By appropriately setting the irradiation direction of the first laser light L1, the direction of the initial leakage light can be controlled. By appropriately setting the irradiation direction of the second laser light L2, the direction of the parting force can be set, the formation direction and position of the modified spot S can be controlled, or the processing mode can be optimized to a specific processing mode (for example, distribution control on residual leakage light).

In the laser processing device 200, as described above, the second laser light L2 has a rotationally asymmetric beam shape that is long along the line 5, and is supplied with large energy and duration. This enables the second stage to be maintained for a long time, and enables the molten solidified region 11 to be increased in the direction of extension of the line 5.

In the present embodiment, the various parameters of the first laser light L1 and the second laser light L2 are not particularly limited to the values as described above. The wavelength of the first laser light L1 may be 1000 nm to 1100 nm. In particular, in the case where the wavelength is 1026 nm, 1028 nm, 1030 nm, 1047 nm, 1064 nm, or 1080 nm, the device can be fabricated easily, which is effective. The wavelength of the first laser light L1 may be 9500 nm to 10000 nm.

In order to achieve a high convergence intensity and a good beam quality, the convergence state of the first laser light L1 may be a state in which the M-squared value is less than 1.2 With respect to the spherical aberration correction to the first laser light L1, aberration-free convergence is possible at the focal point P. A diameter of the focused spot (beam diameter at the focal point) of the first laser light L1 may be φ1 μm or less. The pulse duration of the first laser light L1 may be less than 30 to 50 ns.

The irradiation timing (delay time from the first laser light L1) of the second laser light L2 may be a timing that is after the start of a transient phenomenon such as excitation of local electrons or temperature rise in a partial region due to irradiation of the first laser light L1, is earlier than a time at which the transient phenomenon is finished or attenuated due to the relaxation or thermal diffusion of the excited electrons and carriers or the like diffuse or disappear. The wavelength of the second laser light L2 may be 1150 nm to 9500 nm. It is only required that the wavelength of the second laser light L2 be any wavelength with which the second laser light L2 passes through the object 1. Requirements for the beam quality of the second laser light L2 are greatly relaxed, and for example, the M-squared value of the second laser light L2 may be 4. A diameter of the focused spot (beam diameter at the focal point) of the second laser light L2 may be φ3 μm or so. It is only required that the rise of the pulse waveform of the second laser light L2 is a rise with which a local temperature rise in the partial region due to the irradiation of the first laser light L1 is not relaxed. The pulse rise time of the second laser light L2 may also be 10 to 30 ns.

The pulse duration of the second laser light L2 may be 500 to 5000 ns. The polarization state of the second laser light L2 may be any state. An inexpensive random polarization laser light source may be used as the second light source 202. The convergence state of the second laser light L2 may be set in accordance with the processing request in order to determine the processing performance. As compared with the first laser light L1, for the second laser light L2, the propagation state rather than the focal point is important.

Referring to the above, the first light source 201 and the controller 216 constitute a first irradiation unit, and the second light source 202 and the controller 216 constitute a second irradiation unit.

Figure 11:
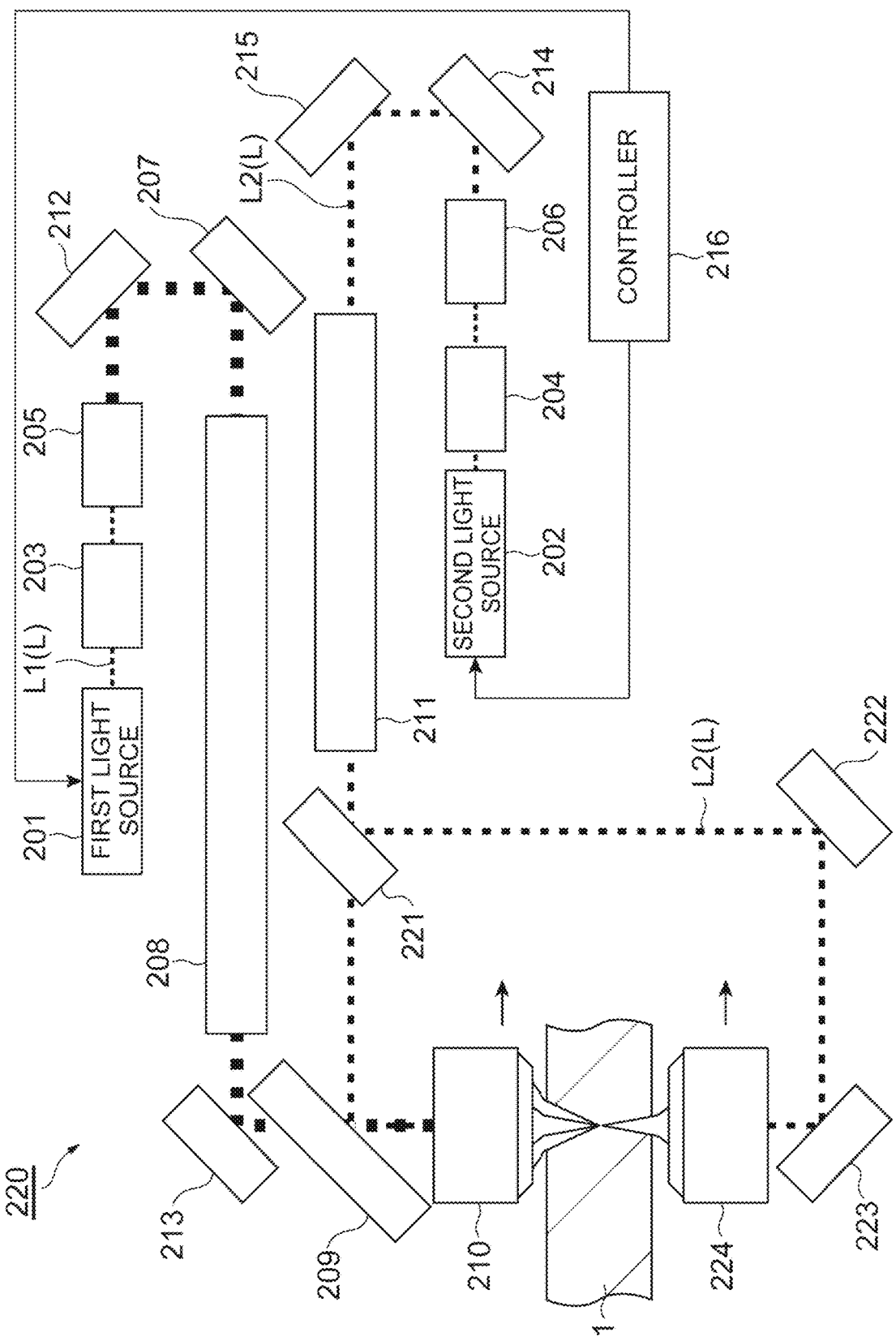
FIG. 11 is a schematic view showing the configuration of a laser processing device according to a first modification of the first embodiment.

FIG. 11 is a schematic view showing the configuration of a laser processing device 220 according to a first modification of the first embodiment. The laser processing device 220 according to the first modification is different from the laser processing device 200 (see FIG. 9) in that the second laser light L2 is further applied so as to face the first laser light L1. The laser processing device 220 further includes a half mirror 221 and a condensing optical system 224 as compared with the laser processing device 200.

The half mirror 221 is disposed between the cylindrical lens unit 211 and the dichroic mirror 209 on the optical path of the second laser light L2. The half mirror 221 reflects a part of the second laser light L2 that has passed through the cylindrical lens unit 211 and transmits the other part of the second laser light L2.

The condensing optical system 224 converges the second laser light L2, which has been reflected from the half mirror 221 and reflected from the mirrors 222 and 223, at the object 1. The condensing optical system 224 is disposed so as to face the condensing optical system 210 with the object 1 interposed therebetween. The condensing optical system 224 causes the second laser light L2 to enter with the back surface (or front surface) opposite to the front surface (or back surface) that is the plane of incidence of laser light of the condensing optical system 210 as a plane of incidence of laser light. The condensing optical system 224 is configured in a manner similar to the condensing optical system 210. As the condensing optical system 224, it is not necessary to use an optical system having a particularly high performance as compared with the condensing optical system 210. In such a laser processing device 220, it is possible to grow and form, in the object 1, the modified spot S on each of the front surface side and the rear surface side of the object 1 by simultaneously irradiating the object 1 with the second laser light L2 from the front surface side and the back surface side.

As described above, the laser processing device 220 also achieves the functional effect by the laser processing device 200. Further, in the laser processing device 220, the irradiation direction of one of the two second laser lights L2 is different from the irradiation direction of the first laser light L1. By appropriately making the irradiation direction different between the first laser light L1 and the second laser light L2, the direction in which the modified spot S and fractures expand can be controlled (can be guided selectively), and the positions of the modified spot S and fractures can be controlled. In particular, in the laser processing device 220, the modified spot S can grow simultaneously from the front surface side and the back surface side by the condensing optical systems 210 and 224 opposed to each other and the parting force can be maximized.

Figure 12:
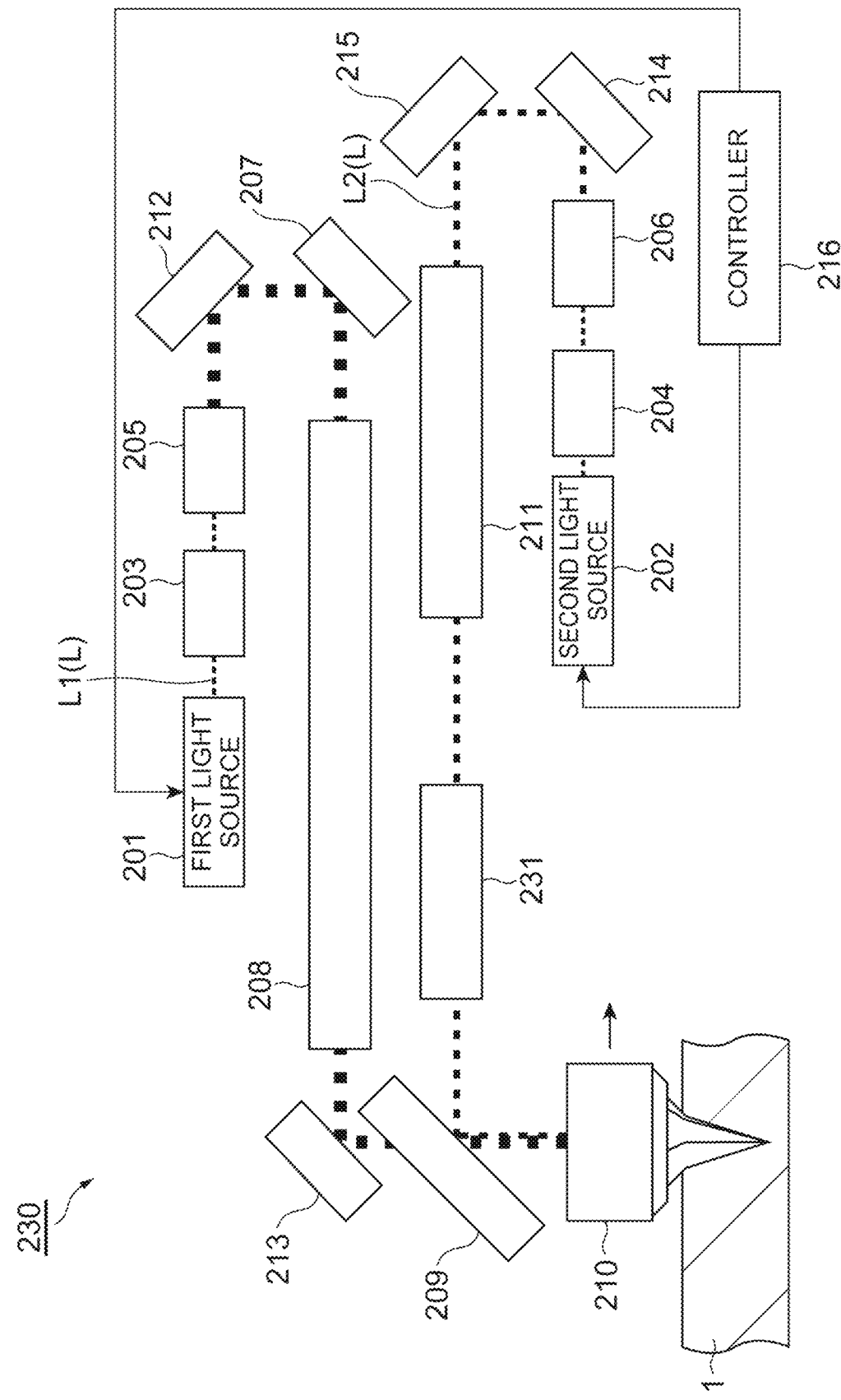
FIG. 12 is a schematic view showing the configuration of a laser processing device according to a second modification of the first embodiment.

FIG. 12 is a schematic view showing the configuration of a laser processing device 230 according to a second modification of the first embodiment. The laser processing device 230 according to the second modification differs from the laser processing device 200 (see FIG. 9) in the device configuration that the laser processing device 230 includes a beam shifter 231.

The beam shifter 231 is disposed between the cylindrical lens unit 211 and the dichroic mirror 209 on the optical path of the second laser light L2. The beam shifter 231 shifts the position of the second laser light L2. Specifically, the beam shifter 231 shifts the position of the second laser light L2 in such a manner that the irradiation direction (optical axis) of the second laser light L2 converged by the condensing optical system 210 becomes an inclination direction inclined with respect to the optical axis of the condensing optical system 210. The inclination direction herein is a direction inclined from the front side to the back side of a scan progress direction of the laser light L (first laser light 1 and second laser light L2) as it approaches the object 1.

The beam shifter 231 is not particularly limited and may be various optical elements as long as the position of the second laser light L2 can be shifted. Hereinafter, the scan progress direction is simply referred to as a "scan direction". The scan direction is a direction in which the laser light L is scanned, and is a processing progress direction.

As described above, the laser processing device 230 also achieves the functional effect by the laser processing device 200. Further, in the laser processing device 230, the second laser light L2 can be applied from the inclination direction inclined with respect to the optical axis of the condensing optical system 210. In particular, since the inclination direction is a direction inclined from the front side to the rear side of the scan direction as it approaches the object 1, the modified spot S can be formed so as to precede the scanning of the laser light L.

Figure 13:
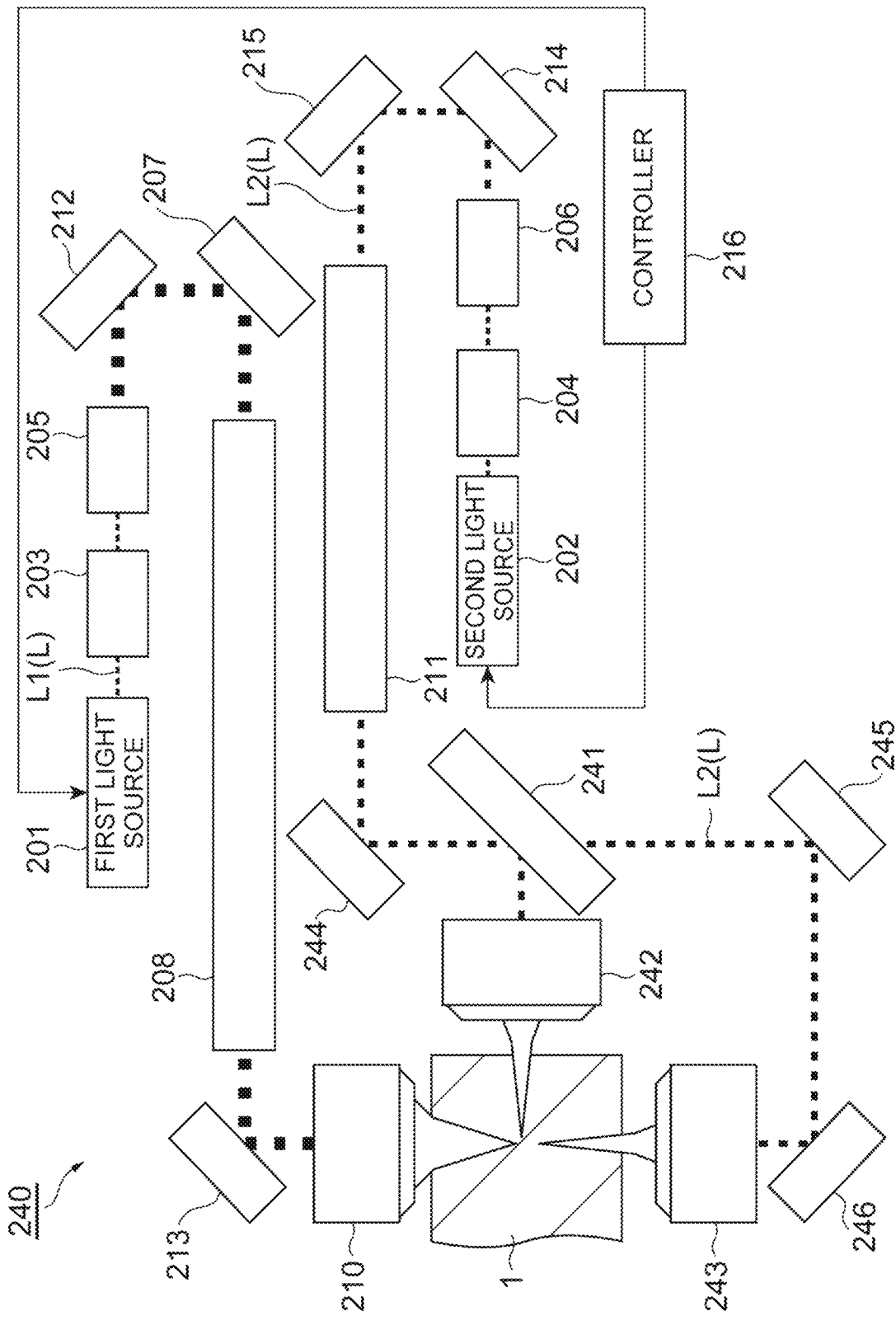
FIG. 13 is a schematic view showing the configuration of a laser processing device according to a third modification of the first embodiment.

FIG. 13 is a schematic view showing the configuration of a laser processing device 240 according to a third modification of the first embodiment. The laser processing device 240 according to the third modification is different from the laser processing device 200 (see FIG. 9) in that the second laser light L2 is applied from a side surface of the object 1 and is applied so as to face the first laser light L1. As compared with the laser processing device 200, the laser processing device 220 does not include the dichroic mirror 209 and further includes a half mirror 241 and condensing optical systems 242 and 243. In the laser processing device 220, the condensing optical system 210 converges only the first laser light L1 at the object 1.

The half mirror 241 is disposed on the downstream side of the cylindrical lens unit 211 on the optical path of the second laser light L2. The half mirror 241 reflects a part of the second laser light L2 that has passed through the cylindrical lens unit 211 and been reflected from the mirror 244, and transmits the other part of the second laser light L2.

The condensing optical system 242 converges the second laser light L2 reflected from the half mirror 241 at the object 1. The condensing optical system 242 is disposed so as to face the side surface of the object 1. The condensing optical system 242 causes the second laser light L2 to enter with the side surface of the object 1 as the plane of incidence of laser light. The condensing optical system 242 is configured in a manner similar to the condensing optical system 210. The condensing optical system 243 converges the second laser light L2, which has passed through the half mirror 221 and been reflected from the mirrors 245 and 246, at the object 1. The condensing optical system 243 is disposed so as to face the condensing optical system 210 with the object 1 interposed therebetween. The condensing optical system 243 causes the second laser light L2 to enter with the back surface (or front surface) opposite to the front surface (or back surface) that is the plane of incidence of laser light of the condensing optical system 210 as a plane of incidence of laser light. The condensing optical system 243 is configured in a manner similar to the condensing optical system 210. As the condensing optical systems 242 and 243, it is not necessary to use an optical system having a particularly high performance as compared with the condensing optical system 210.

In the laser processing device 240, it is possible to grow, in the object 1, the modified spot S on each of the opposite side to the irradiation direction of the first laser light L1 and the side surface side of the object 1 by simultaneously irradiating the object 1 with the second laser light L2 from the opposite side to the irradiation direction of the first laser light L1 and the side surface side of the object 1.

As described above, the laser processing device 240 also achieves the functional effect by the laser processing device 200. Further, in the laser processing device 240, since the second laser light L2 is applied from the opposite side to the irradiation direction of the first laser light L1 and the side surface side of the object 1, the direction in which the modified spot S and fractures expand can be controlled (can be guided selectively) to the opposite side to the irradiation direction of the first laser light L1 and the side surface side of the object 1. Further, since the second laser light L2 is applied from the opposite side to the irradiation direction of the first laser light L1 and the side surface side of the object 1, the backside damage caused by the passing light can be essentially avoided.

Second Embodiment

The description goes on to a laser processing device according to the second embodiment. Hereinafter, differences from the first embodiment are described, and redundant descriptions are omitted.

Figure 14:
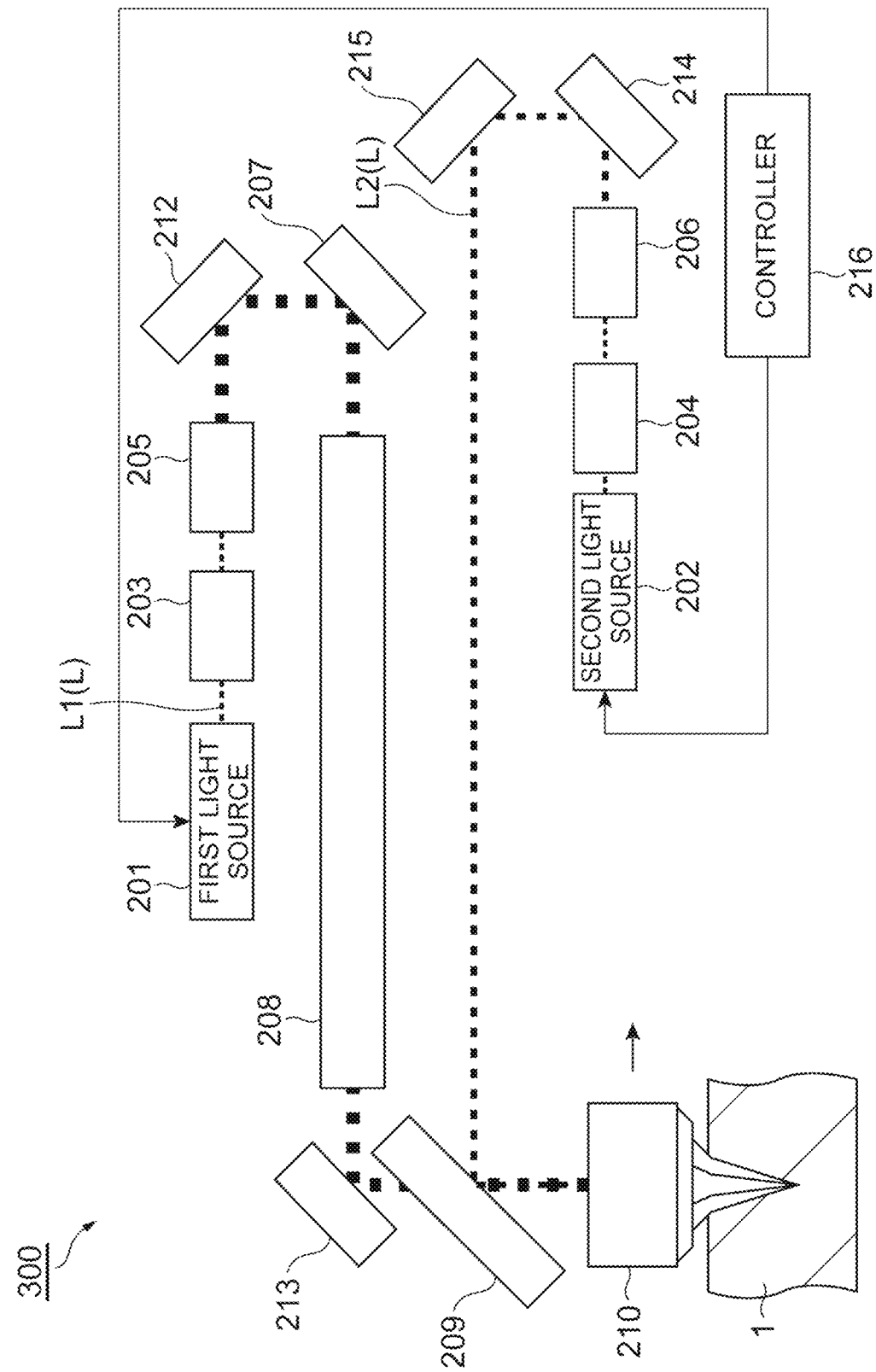
FIG. 14 is a schematic view showing the configuration of a laser processing device according to a second embodiment.

A laser processing device 300 according to the second embodiment shown in FIG. 14 is a device having specifications in which damage control to the object 1 is given priority, is configured to control damage (particularly back surface damage) to the object 1 and cut the object 1 along the thickness direction. The laser processing device 300 differs from the laser processing device 200 in the device configuration that the laser processing device 300 does not include the cylindrical lens unit 211. Without the cylindrical lens unit 211, both the first laser light L1 and the second laser light L2 have a rotationally symmetric beam profile, and the propagation paths and focal points of the first laser light L1 and the second laser light L2 are made to further conform with each other. As a result, the second laser light L2 can be more efficiently applied to a partial region where the absorptivity is temporarily increased due to excitation by the first laser light L1.

In the laser processing device 300, priority is given to control on leakage light of the first laser light L1. The first laser light L1 has a steep rising waveform at a wavelength with which absorption of the object 1 is large. With the first laser light L1, only the first stage can be performed with minimum leakage light. In the laser processing device 300, the second laser light L2 has a wavelength near the band gap of the object 1 or longer than the band gap thereof, a rotationally symmetric beam profile, large energy, a steep rising pulse waveform, and a long pulse duration. Thereby, the second laser light L2 is applied so as to temporally and spatially coincide with the partial region where the absorptivity is temporarily increased with the irradiation of the first laser light L1, the second stage is maintained, and the molten solidified region 11 can be expanded.

The laser processing device 300 herein is configured to have the following characteristics with respect to the first laser light L1 and the second laser light L2 applied to the object 1.

(Wavelength)
First laser light L1: 1026 to 1064 nm
Second laser light L2: 1120 to 2000 nm
(Beam Quality (M-Squared Value))
First laser light L1: 1.0
Second laser light L2: less than 3.0
(Pulse Duration)
First laser light L1: 10 to 30 ns
Second laser light L2: 0.5 to 1 µs
(Pulse Rise Time)
First laser light L1: less than 3 ns
Second laser light L2: less than 50 ns
(Pulse Waveform)
First laser light L1: rectangular waveform or Gaussian waveform
Second laser light L2: backward rise waveform (square curve)
(Peak Intensity)
First laser light L1: 70 W
Second laser light L2: 150 to 250 W
(Repetition Frequency)
First laser light L1: 300 kHz or less
Second laser light L2: 300 kHz or less
(Irradiation Timing)
First laser light L1: arbitrary
Second laser light L2: 15 to 20 ns later
(starting from the start of irradiation of the first laser light L1)
(optimization on the basis of the pulse width of the first laser light L1, rising of the first laser light L1, and rising of the second laser light L2)
(Condensing System)
First laser light L1: convergence given priority
Second laser light L2: path given priority
(Aberration Correction)
First laser light L1: yes
Second laser light L2: none
(Symmetry of Beam Profile)
First laser light L1: rotational symmetry (perfect circle)
Second laser light L2: rotational symmetry (perfect circle)
(NA)
First laser light L1: 0.7 or more
Second laser light L2: 0.2 to 0.6

As described above, the laser processing device 300 also achieves the functional effect by the laser processing device 200. In particular, in the laser processing device 300, it is possible to suppress the passing light and control damage to the object 1 by using a simple and inexpensive optical system.

Figure 15:
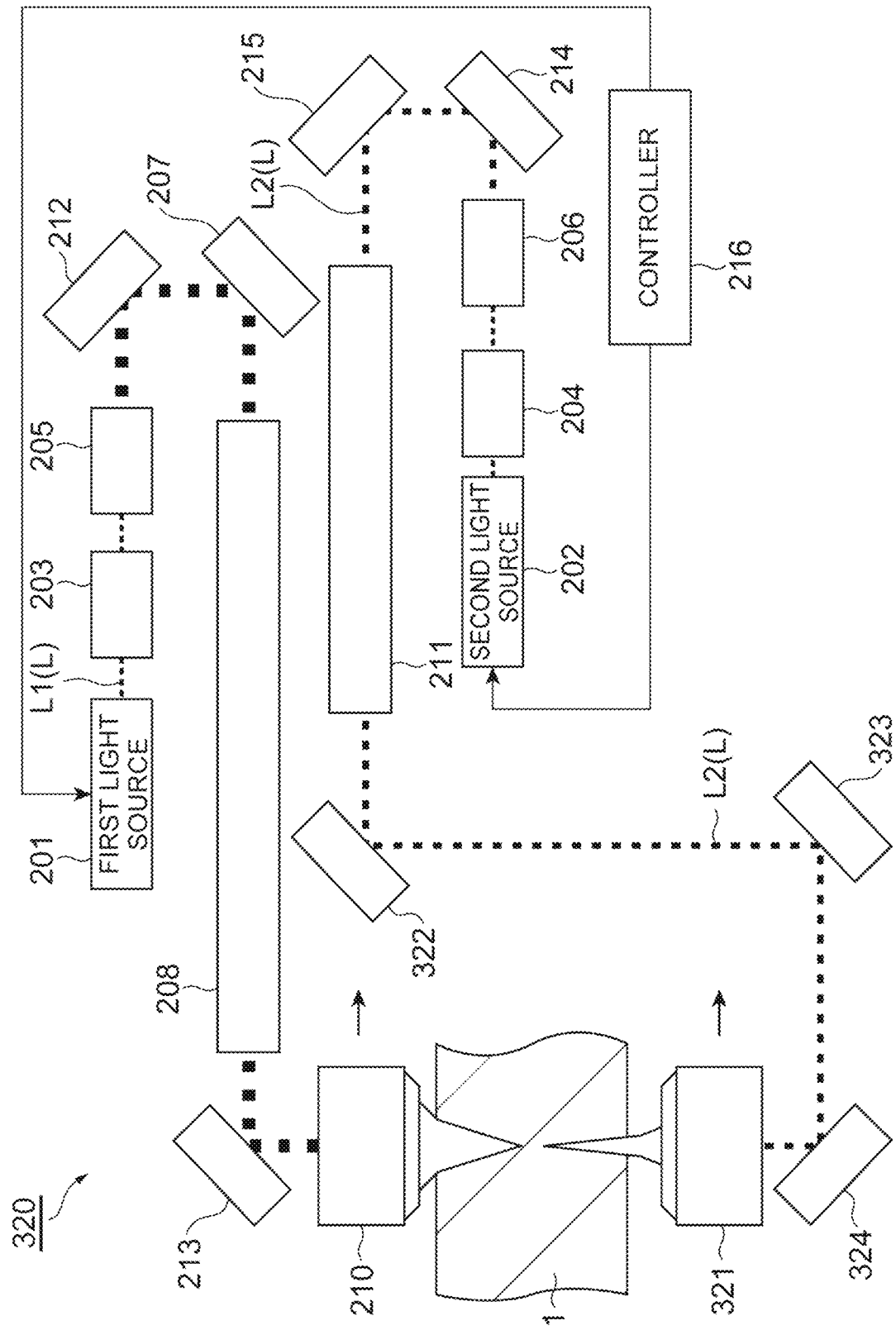
FIG. 15 is a schematic view showing the configuration of a laser processing device according to a modification of the second embodiment.

FIG. 15 is a schematic view showing the configuration of a laser processing device 320 according to a modification of the second embodiment. The laser processing device 320 according to the modification is different from the laser processing device 300 (see FIG. 14) in that the second laser light L2 is applied so as to face the first laser light L1. As compared with the laser processing device 300, the laser processing device 320 does not include the dichroic mirror 209 and further includes a condensing optical system 321. In the laser processing device 320, the condensing optical system 210 converges only the first laser light L1 at the object 1.

The condensing optical system 321 converges the second laser light L2, which has passed through the second beam expander 206 and been reflected from the mirrors 214, 215, 322, 323, and 324, at the object 1. The condensing optical system 321 is disposed so as to face the condensing optical system 210 with the object 1 interposed therebetween. The condensing optical system 321 causes the second laser light L2 to enter with the back surface (or front surface) opposite to the front surface (or back surface) that is the plane of incidence of laser light of the condensing optical system 210 as the plane of incidence of laser light. The condensing optical system 321 is configured in a manner similar to the condensing optical system 210. As the condensing optical system 321, it is not necessary to use an optical system having a particularly high performance as compared with the condensing optical system 210.

In the laser processing device 320, it is possible to grow and form, in the object 1, the modified spot S to the opposite side to the irradiation direction of the first laser light L1 by irradiating the object 1 with the second laser light L2 from the opposite side to the irradiation direction of the first laser light L1.

As described above, the laser processing device 320 also achieves the functional effect by the laser processing device 300. Further, in the laser processing device 320, the direction in which the modified spot S and fractures expand at the formation of the modified spot S can be controlled (can be guided selectively) to the opposite side to the irradiation direction of the first laser light L1 by applying the second laser light L2 from the opposite side to the irradiation direction of the first laser light L1. The backside damage caused by the passing light can be essentially avoided by applying the second laser light L2 from the opposite side to the irradiation direction of the first laser light L1.

Third Embodiment

The description goes on to a laser processing device according to the third embodiment. Hereinafter, differences from the first embodiment are described, and redundant descriptions are omitted.

Figure 16:
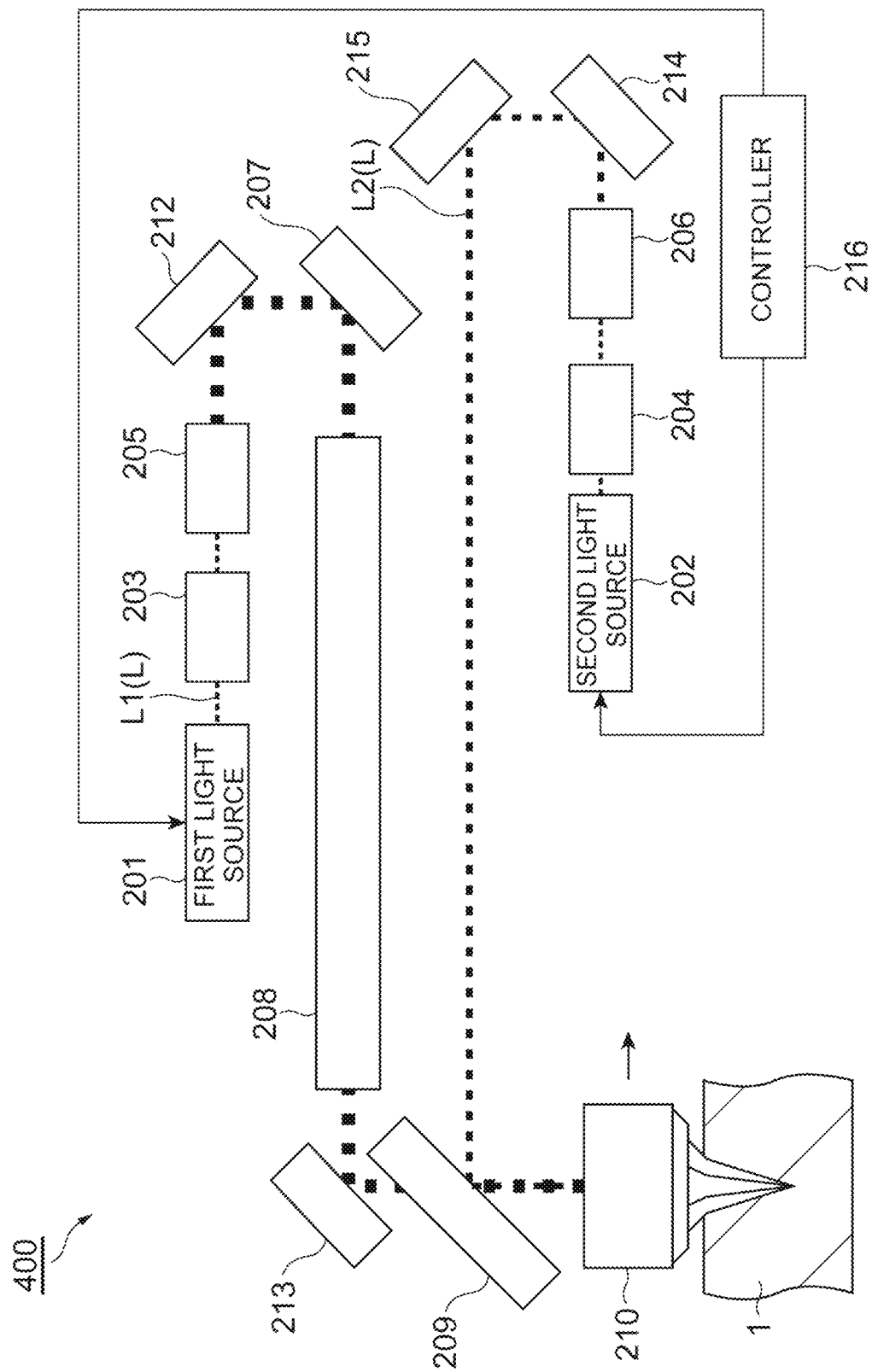
FIG. 16 is a schematic view showing the configuration of a laser processing device according to a third embodiment.

A laser processing device 400 according to the third embodiment shown in FIG. 16 can form a modified spot S that is long in the thickness direction on the object 1. The laser processing device 400 differs from the laser processing device 200 (see FIG. 9) in the device configuration that the laser processing device 400 does not include the cylindrical lens unit 211. Without the cylindrical lens unit 211, both the first laser light L1 and the second laser light L2 have a rotationally symmetric beam profile, and the propagation paths and focal points of the first laser light L1 and the second laser light L2 are made to further conform with each other. As a result, the second laser light L2 can be more efficiently applied to a partial region where the absorptivity is temporarily increased due to excitation by the first laser light L1.

The laser processing device 400 herein is configured to have the following characteristics with respect to the first laser light L1 and the second laser light L2 applied to the object 1.

(Wavelength)
First laser light L1: 1026 to 1064 nm
Second laser light L2: 1120 to 2000 nm
(Beam Quality (M-Squared Value))
First laser light L1: 1.0
Second laser light L2: less than 2.0
(Pulse Duration)
First laser light L1: 20 to 80 ns
Second laser light L2: 2 to 200 μs
(Pulse Rise Time)
First laser light L1: less than 3 ns
Second laser light L2: less than 50 ns
(Pulse Waveform)
First laser light L1: rectangular waveform or Gaussian waveform
Second laser light L2: backward rise waveform (square curve) or rectangular waveform
(Peak Intensity)
First laser light L1: 70 W
Second laser light L2: 150 to 250 W
(Repetition Frequency)
First laser light L1: 300 kHz or less
Second laser light L2: 300 kHz or less
(Irradiation Timing)
First laser light L1: arbitrary
Second laser light L2: 15 to 20 ns later (starting from the start of irradiation of the first laser light L1)
(Condensing System)
First laser light L1: convergence given priority
Second laser light L2: path given priority
(Aberration Correction)
First laser light L1: yes
Second laser light L2: none
(Symmetry of Beam Profile)
First laser light L1: rotational symmetry (perfect circle)
Second laser light L2: rotational symmetry (perfect circle) or cross section of arbitrary shape
(NA)
First laser light L1: 0.7 or more
Second laser light L2: 0.4 to 0.6

As described above, the laser processing device 400 also achieves the functional effect by the laser processing device 200. In particular, in the laser processing device 400, it is possible to form the modified spot S that is long in the thickness direction and the modified region 7 on the object 1.

Figure 17:
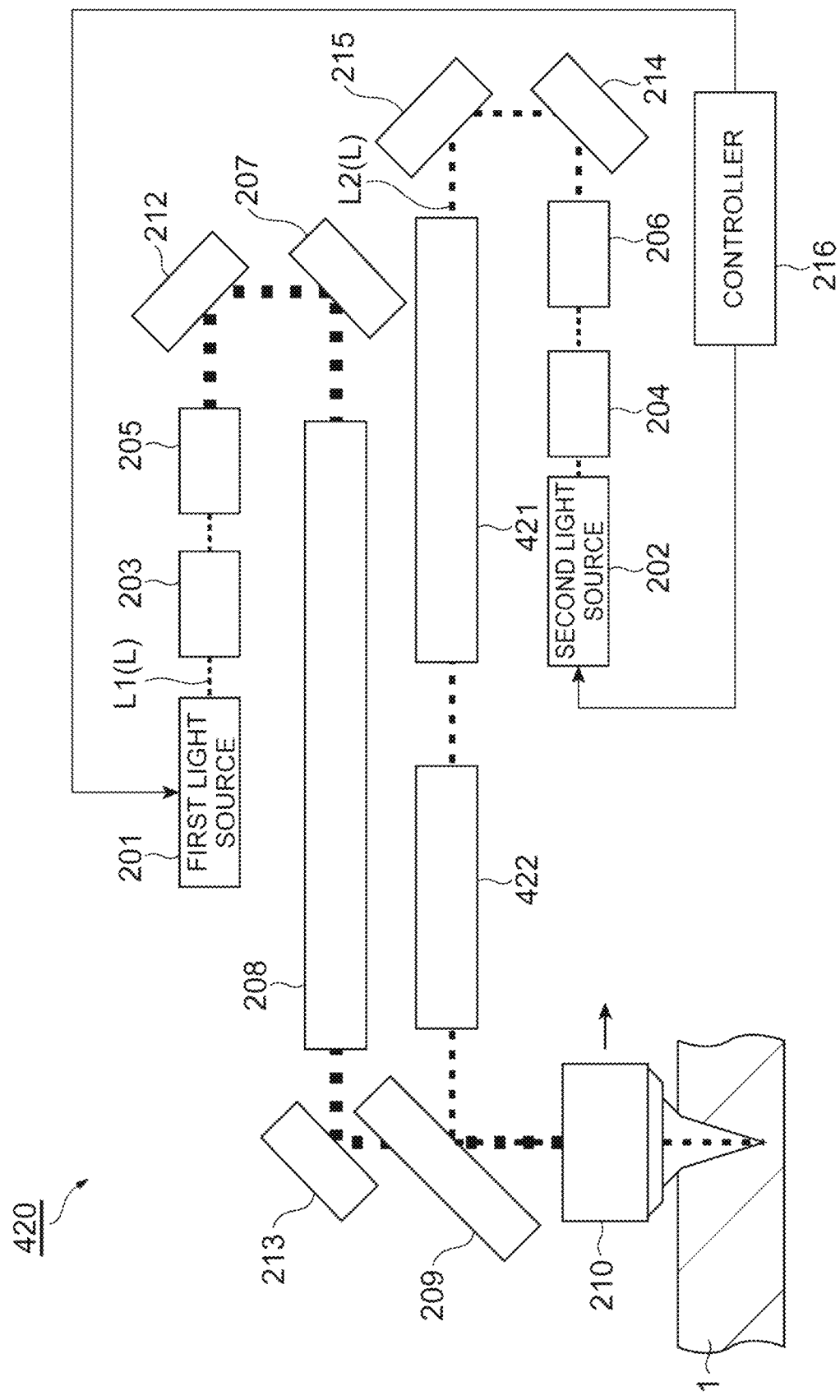
FIG. 17 is a schematic view showing the configuration of a laser processing device according to a modification of the third embodiment.

FIG. 17 is a schematic view showing the configuration of a laser processing device 420 according to a modification of the third embodiment. The laser processing device 420 according to the modification differs from the laser processing device 400 (see FIG. 16) in the device configuration that a cylindrical lens unit 421 and a beam shifter 422 are further provided between the mirror 215 and the dichroic mirror 209 on the optical path of the second laser light L2.

The cylindrical lens unit 421 is configured in a manner similar to the cylindrical lens unit 211 (see FIG. 9). The beam shifter 422 is configured in a manner similar to the beam shifter 231 (see FIG. 12). In the laser processing device 420, it is possible to apply the second laser light L2, as a parallel beam, to the object 1.

As described above, the laser processing device 420 also achieves the functional effect by the laser processing device 400. Further, in the laser processing device 420, it is possible to form an unlimitedly long modified spot S on the side of a plane of incident of the second laser light L2 by irradiating the object 1 with the second laser light L2 as a parallel beam.

Fourth Embodiment

The description goes on to a laser processing device according to the fourth embodiment. Hereinafter, differences from the first embodiment are described, and redundant descriptions are omitted.

Figure 18:
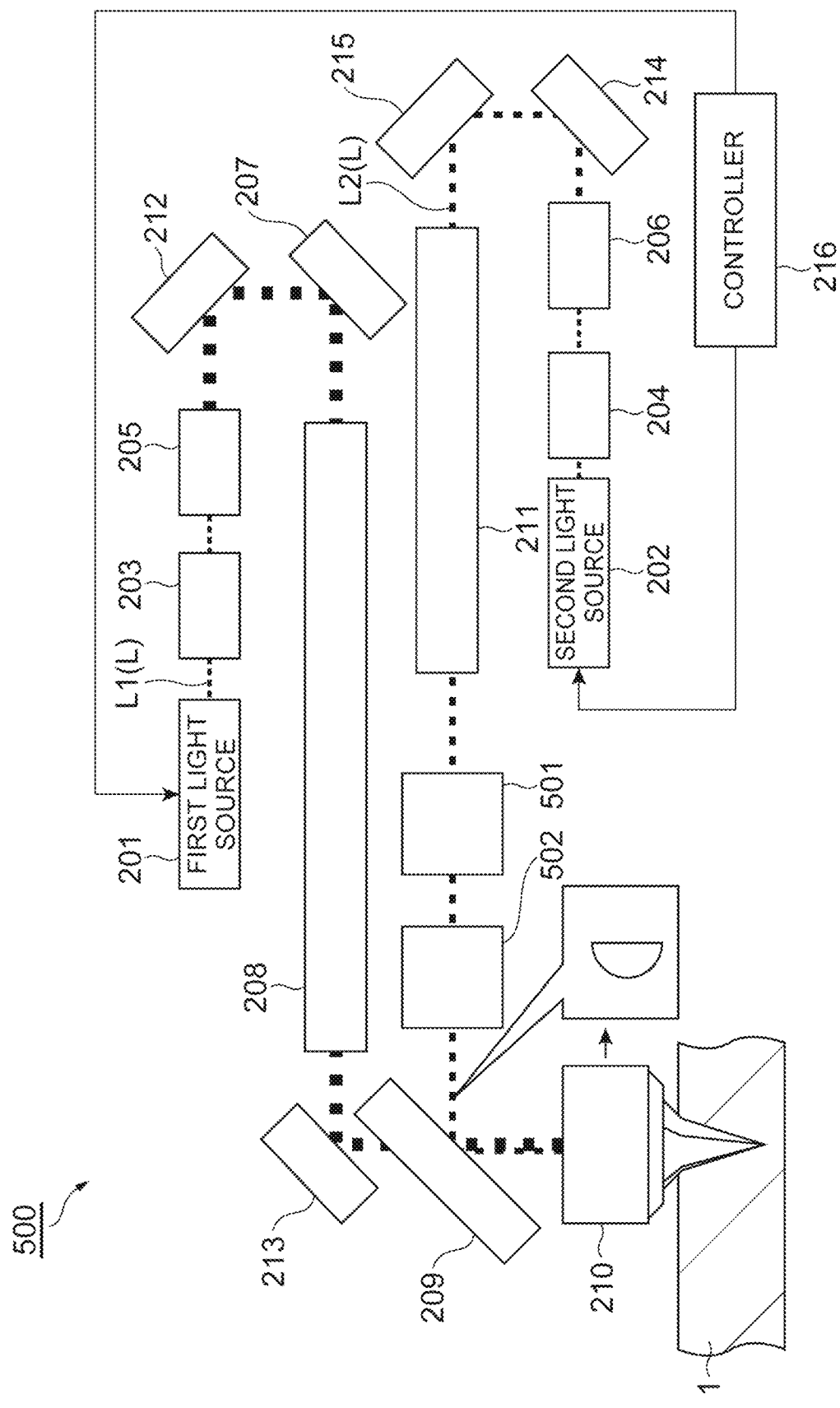
FIG. 18 is a schematic view showing the configuration of a laser processing device according to a fourth embodiment.

A laser processing device 500 according to the fourth embodiment shown in FIG. 18 can cut the object 1 independently of the cleavage direction of the object 1. The laser processing device 500 differs from the laser processing device 200 (see FIG. 9) in the device configuration that the laser processing device 500 further includes a beam shifter 501 and a beam shaper 502.

The beam shifter 501 shifts the position of the second laser light L2. Specifically, the beam shifter 501 shifts the position of the second laser light L2 in such a manner that the irradiation direction of the second laser light L2 converged by the condensing optical system 210 becomes an inclination direction inclined with respect to the optical axis of the condensing optical system 210. The inclination direction herein is a direction inclined from the back side to the front side of the scan direction as it approaches the object 1. Note that the beam shifter 501 is not particularly limited and may be various optical elements as long as the position of the second laser light L2 can be shifted.

The beam shaper 502 shapes the beam profile of the second laser light L2 into a deformed profile asymmetrical with respect to the scan direction. To be specific, the beam shaper 502 forms the beam profile of the second laser light L2 so that the second laser light L2 converged by the condensing optical system 210 has a semicircular (semicircle of the rear half in the scan direction) beam profile in which the front side in the scan direction is lacked.

As described above, the laser processing device 500 also achieves the functional effect by the laser processing device 200. In particular, the laser processing device 500 can suppress fractures on the front side in the scan direction and generate fractures on the back side in the scan direction. The object 1 can be cut along the line 5 independently of the cleavage direction of the object 1.

Fifth Embodiment

The description goes on to a laser processing device according to the fifth embodiment. Hereinafter, differences from the first embodiment are described, and redundant descriptions are omitted.

Figure 19:
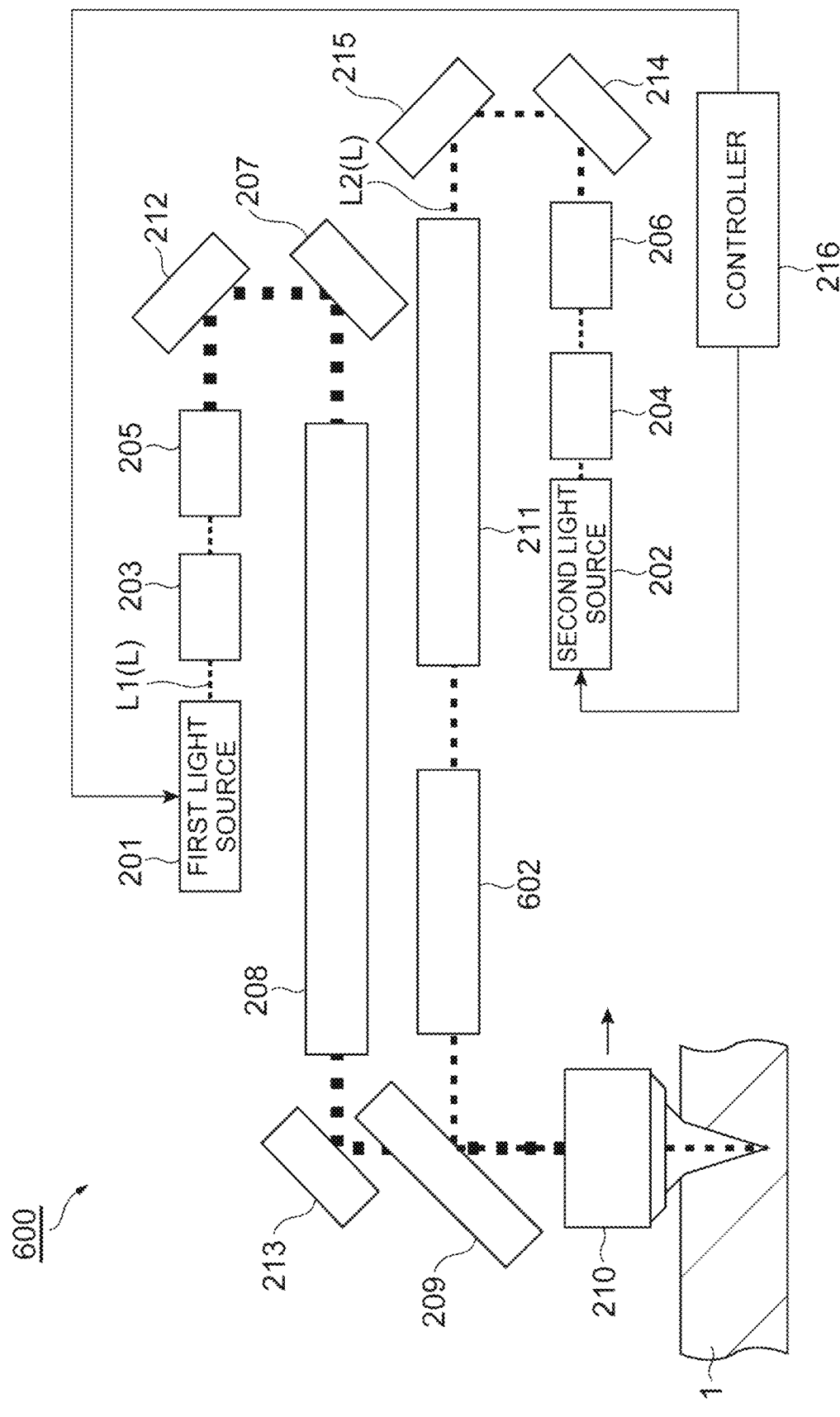
FIG. 19 is a schematic view showing the configuration of a laser processing device according to a fifth embodiment.

A laser processing device 600 according to the fifth embodiment shown in FIG. 19 can form a modified spot S that is long in the thickness direction on the object 1 independently of the crystal orientation. The laser processing device 600 differs from the laser processing device 200 (see FIG. 9) in the device configuration that the laser processing device 600 further includes a beam shifter 602 between the cylindrical lens unit 211 and the dichroic mirror 209 on the optical path of the second laser light L2. The cleavage direction of the object 1 according to this embodiment is not along the extending direction of the line 5 and crosses the line 5.

The beam shifter 602 is configured in a manner similar to the beam shifter 231 (see FIG. 12). In the laser processing device 600, it is possible to apply the second laser light L2, as a parallel beam, to the object 1. The controller 216 of the present embodiment controls the irradiation timing of the second laser light L2, and controls the solidification rate of the molten solidified region 11 so that no fractures are generated.

As described above, the laser processing device 600 also achieves the functional effect by the laser processing device 200. In particular, in the laser processing device 600, it is possible to form a modified spot S that is long in the thickness direction while the occurrence of fractures in the cleavage direction is suppressed by irradiating the object 1 with the second laser light L2 as a parallel beam.

Sixth Embodiment

The description goes on to a laser processing device according to the sixth embodiment. Hereinafter, differences from the first embodiment are described, and redundant descriptions are omitted.

Figure 20:
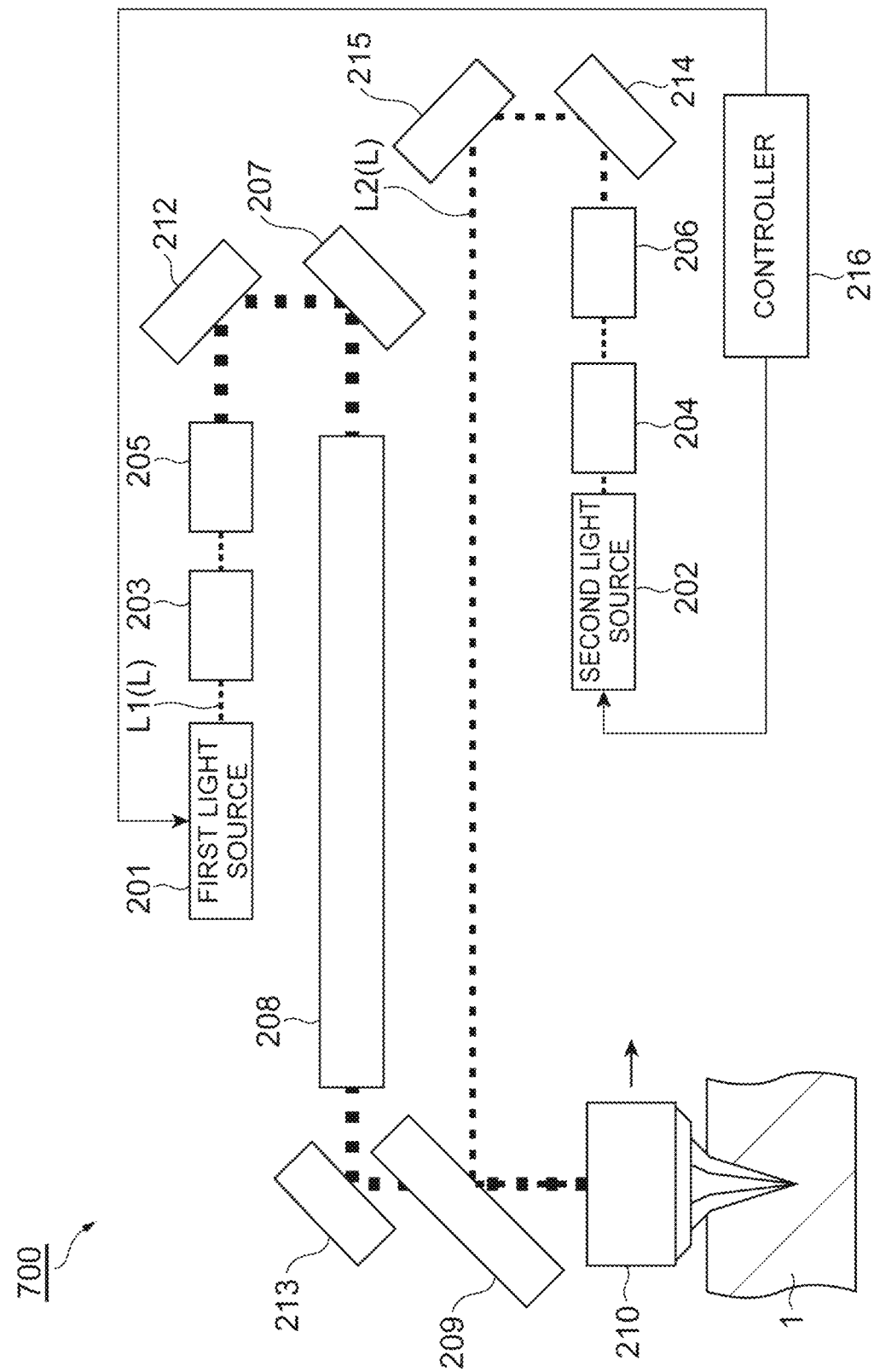
FIG. 20 is a schematic view showing the configuration of a laser processing device according to a sixth embodiment.

A laser processing device 700 according to the sixth embodiment shown in FIG. 20 enables an inexpensive device configuration. The laser processing device 700 differs from the laser processing device 200 (see FIG. 9) in the device configuration that the laser processing device 700 does not include the second attenuator 204 and the cylindrical lens unit 601, and includes a first light source 701 and a second light source 702 instead of the first light source 201 and the second light source 202, respectively.

The first light source 701 is a light source whose output is smaller than that of the first light source 201 (see FIG. 9). The second light source 702 is a light source using a laser diode, a continuous wave (CW) fiber laser, or a quasi continuous wave (QCW) fiber laser. As an example, the second light source 702 emits the second laser light L2 having a wavelength of 1064 nm and a pulse duration of 1 µs.

As described above, the laser processing device 700 also achieves the functional effect by the laser processing device 200. In particular, in the laser processing device 700, a very inexpensive processing device can be configured.

Seventh Embodiment

The description goes on to a laser processing device according to the seventh embodiment. Hereinafter, differences from the first embodiment are described, and redundant descriptions are omitted.

Figure 21:
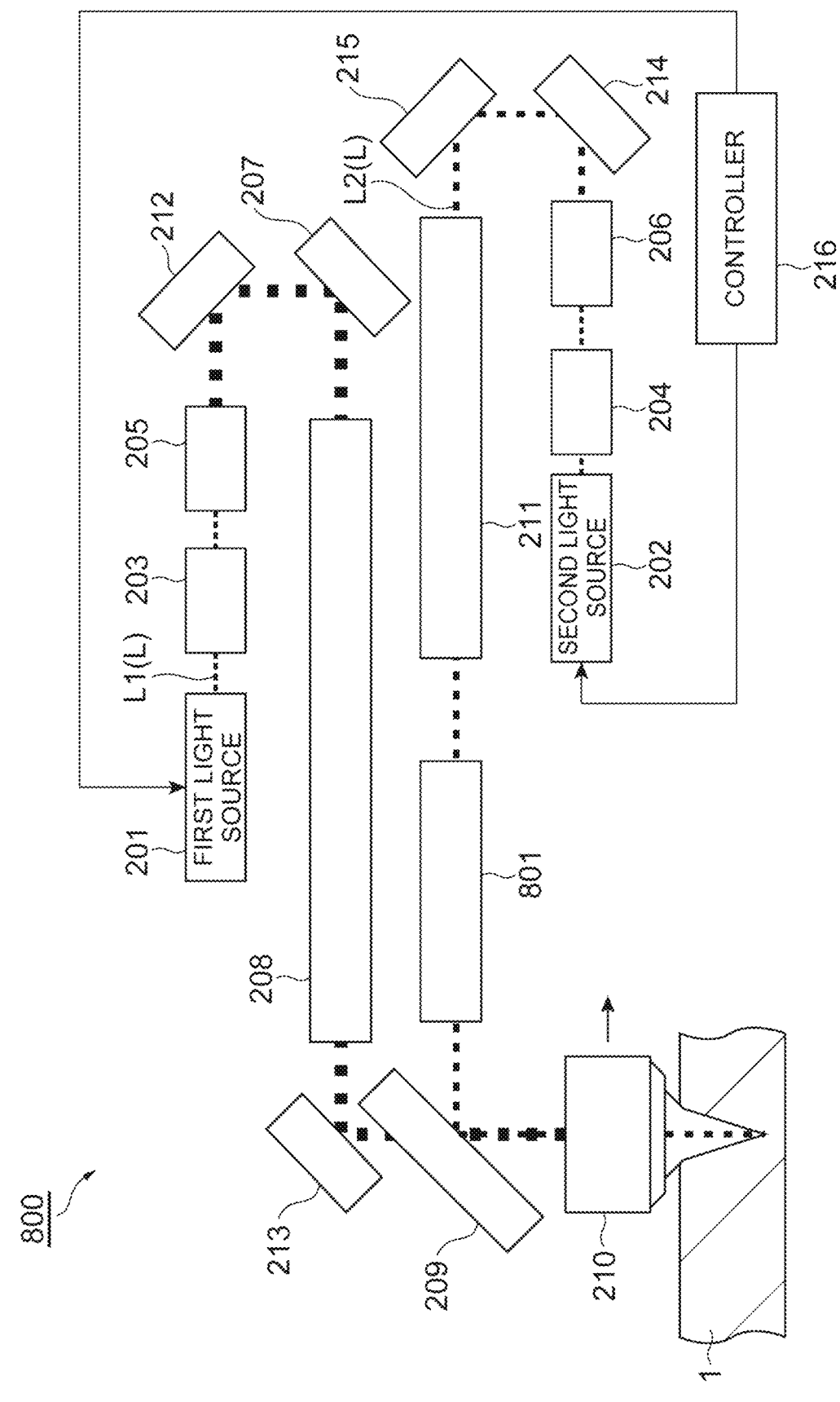
FIG. 21 is a schematic view showing the configuration of a laser processing device according to a seventh embodiment.

A laser processing device 800 according to the seventh embodiment shown in FIG. 21 can cut (slice) the object 1 along a direction orthogonal to (intersecting) the thickness direction. In the laser processing device 800, the laser light L (first laser light L1 and second laser light L2) is made incident from a direction orthogonal to a surface to slice set on the object 1, and a planar modified region 7 along the surface to slice is formed inside the object 1. The modified region 7 of the present embodiment is a cutting start region for slicing.

The surface to slice is a virtual surface for slicing the object 1 and extends in a planar shape. The surface to slice is not limited to the planar shape but may be a curved shape, a three-dimensional shape in which these shapes are combined, or may be a surface in which coordinates are specified. The surface to slice is a surface to form a modified region. The surface to form a modified region is a planned surface on which the modified region 7 is to be formed.

The laser processing device 800 differs from the laser processing device 200 (see FIG. 9) in the device configuration that the laser processing device 800 further includes a beam shifter 801 between the cylindrical lens unit 211 and the dichroic mirror 209 on the optical path of the second laser light L2. The beam shifter 801 is configured in a manner similar to the beam shifter 231 (see FIG. 12). In the laser processing device 600, it is possible to apply the second laser light L2, as a parallel beam, to the object 1. The controller 216 of the present embodiment controls the irradiation timing of the second laser light L2, and controls the solidification rate of the molten solidified region 11 so that no fractures are generated in the thickness direction.

In the laser processing device 800, the first laser light L1 has a wavelength near the band gap or longer than the band gap and a steep rising pulse waveform. The pulse waveform of the first laser light L1 is a rectangular waveform or a Gaussian waveform. The first laser light L1 is applied only for a short time to a depth position of the surface to slice of the object 1 or a depth position deeper than the same. By the irradiation of the first laser light L1, the absorption phenomenon of the first stage is induced, at a minimum height (width in the thickness direction) on the surface to slice.

On the other hand, the second laser light L2 has a wavelength with which no absorption occurs with respect to the object 1 in the base state. The second laser light L2 has a pulse waveform. The pulse waveform of the second laser light L2 is a rectangular waveform or a Gaussian waveform. The second laser light L2 is intermittently applied to the object 1 in a short time. This allows the second stage to be intermittently produced, and prevents the modified spot S from deviating in the thickness direction from the surface to slice. In line with this, for easy parting on the surface to slice, the modified region 7 along the surface to slice is formed by simultaneous irradiation at a plurality of points, and so on. Expansion of fractures in the thickness direction is suppressed.

The laser processing device 800 herein is configured to have the following characteristics with respect to the first laser light L1 and the second laser light L2 applied to the object 1.
- (Wavelength)
- First laser light L1: 1026 to 1064 nm
- Second laser light L2: 1180 to 1700 nm
- (Beam Quality (M-Squared Value))
- First laser light L1: 1.0
- Second laser light L2: less than 3.0
- (Pulse Duration)
- First laser light L1: 10 to 50 ns
- Second laser light L2: 0.3 to 0.7 μs
- (Pulse Rise Time)
- First laser light L1: less than 3 ns
- Second laser light L2: less than 50 ns
- (Pulse Waveform)
- First laser light L1: rectangular waveform or Gaussian waveform
- Second laser light L2: Rectangular waveform or Gaussian waveform
- (Peak Intensity)
- First laser light L1: 70 W
- Second laser light L2: 150 to 250 W
- (Repetition Frequency)
- First laser light L1: 300 kHz or less
- Second laser light L2: 300 kHz or less
- (Irradiation Timing)
- First laser light L1: arbitrary
- Second laser light L2: 20 to 30 ns later
- (a Plurality of Pulse Trains)
- (Condensing System)
- First laser light L1: convergence given priority
- Second laser light L2: path given priority
- (Aberration Correction)
- First laser light L1: yes
- Second laser light L2: none
- (Symmetry of Beam Profile)
- First laser light L1: rotational symmetry (perfect circle)
- Second laser light L2: quadrangular
- (NA)
- First laser light L1: 0.7 or more
- Second laser light L2: 0.6 or more As described above, the laser processing device 800 also achieves the functional effect by the laser processing device 200. In particular, in the laser processing device 800, the modified region 7 is a cutting start region in the case of slicing the object 1. Thereby, the object 1 can be sliced with the modified region 7 acting as a start point of cutting.

Figure 22:
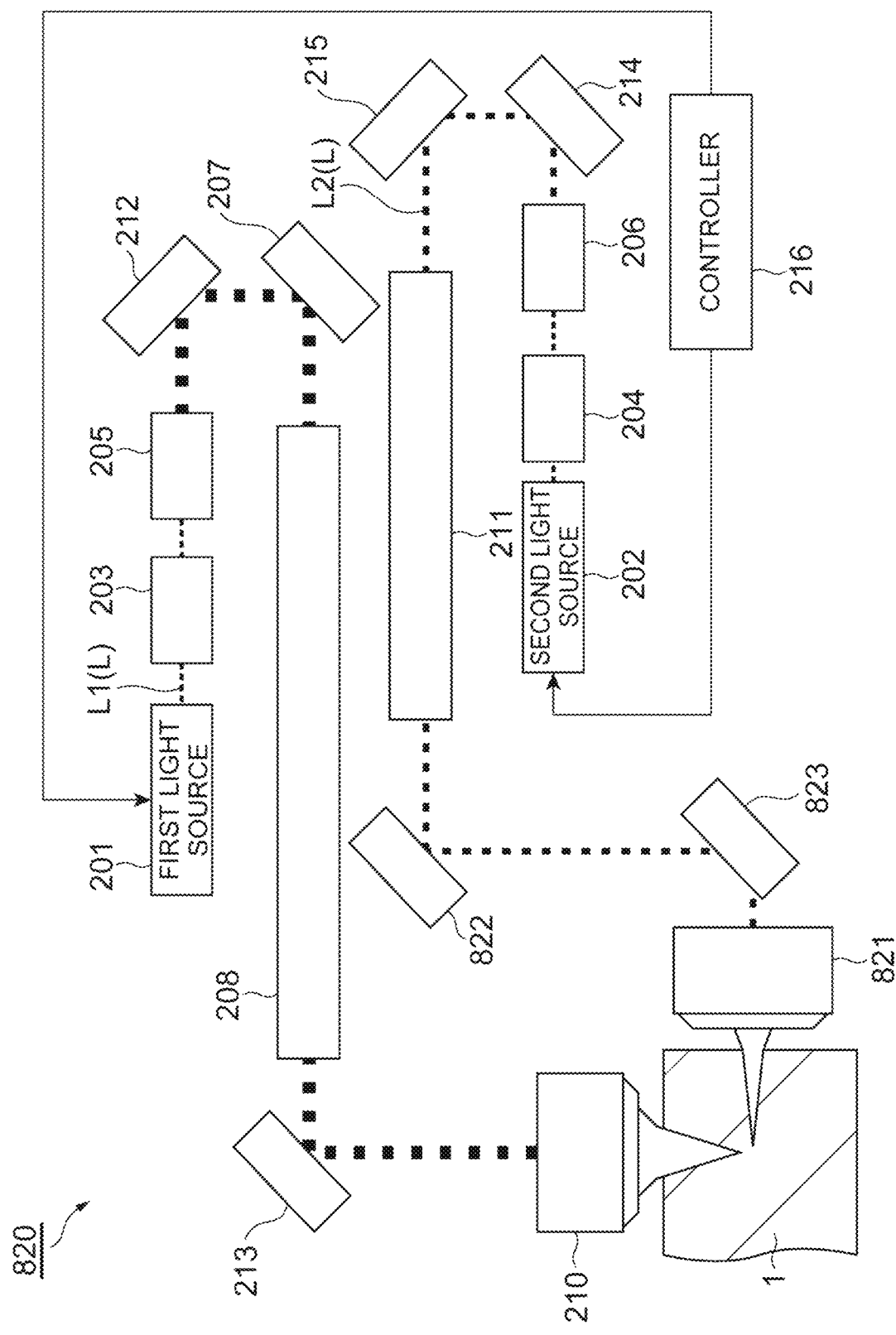
FIG. 22 is a schematic view showing the configuration of a laser processing device according to a modification of the seventh embodiment.

FIG. 22 is a schematic view showing the configuration of a laser processing device 820 according to a modification of the seventh embodiment. The laser processing device 820 according to the modification is different from the laser processing device 800 (see FIG. 21) in that the laser processing device 820 applies the second laser light L2 from a side surface of the object 1. As compared with the laser processing device 800, the laser processing device 820 does not include the dichroic mirror 209 and further includes a condensing optical system 821. In the laser processing device 820, the condensing optical system 210 converges only the first laser light L1 at the object 1.

The condensing optical system 821 converges the second laser light L2, which has passed through the cylindrical lens unit 211 and been reflected from the mirrors 822 and 823, at the object 1. The condensing optical system 821 is disposed so as to face the side surface of the object 1. The condensing optical system 821 causes the second laser light L2 to enter with the side surface of the object 1 as the plane of incidence of laser light. The condensing optical system 821 is configured in a manner similar to the condensing optical system 210. As the condensing optical system 821, it is not necessary to use an optical system having a particularly high performance as compared with the condensing optical system 210.

In the laser processing device 820, the first laser light L1 has a wavelength near the band gap or longer than the band gap and a steep rising pulse waveform. The first laser light L1 is applied to the surface to slice of the object 1. The first laser light L1 satisfies damage control conditions. By such irradiation of the first laser light L1, the temporary induction of the absorption region of the first stage is minimized. On the other hand, the second laser light L2 has a wavelength with which no absorption occurs with respect to the object 1 in the base state, a large energy, and a long pulse duration. The second laser light L2 satisfies the parting force priority conditions. The second laser light L2 has a beam profile along the surface to slice. The second laser light L2 is applied from the direction along the surface to slice to the surface to slice with a beam profile along the surface to slice. This allows the second stage to be maintained for a long time, the molten solidified region 11 to be enlarged in the surface to slice, and a large parting force to be generated.

The laser processing device 820 herein is configured to have the following characteristics with respect to the first laser light L1 and the second laser light L2 applied to the object 1.
- (Wavelength)
- First laser light L1: 1026 to 1064 nm
- Second laser light L2: 1180 to 7500 nm
- (Beam Quality (M-Squared Value))
- First laser light L1: 1.0
- Second laser light L2: less than 2.0

(Pulse Duration)
First laser light L1: 10 to 30 ns
Second laser light L2: 0.7 to 5 μs
(Pulse Rise Time)
First laser light L1: less than 3 ns
Second laser light L2: less than 50 ns
(Pulse Waveform)
First laser light L1: rectangular waveform or Gaussian waveform
Second laser light L2: backward rise waveform (square curve)
(Peak Intensity)
First laser light L1: 70 W
Second laser light L2: 150 to 250 W
(Repetition Frequency)
First laser light L1: 150 kHz or less
Second laser light L2: 150 kHz or less
(Irradiation Timing)
First laser light L1: arbitrary
Second laser light L2: 20 to 30 ns later
(Condensing System)
First laser light L1: convergence given priority
Second laser light L2: path given priority
(Aberration Correction)
First laser light L1: yes
Second laser light L2: depends on depth
(Symmetry of Beam Profile)
First laser light L1: rotational symmetry (perfect circle)
Second laser light L2: long along the surface to slice
(NA)
First laser light L1: 0.7 or more
Second laser light L2: 0.05 to 0.4

As described above, the laser processing device 820 also achieves the functional effect by the laser processing device 800. Further, in the laser processing device 820, the direction in which the modified spot S and fractures expand can be controlled (can be guided selectively) to the direction along the surface to slice by applying the second laser light L2 from the direction along the surface to slice.

Eighth Embodiment

The description goes on to a laser processing device according to the eighth embodiment. Hereinafter, differences from the first embodiment are described, and redundant descriptions are omitted.

Figure 23:
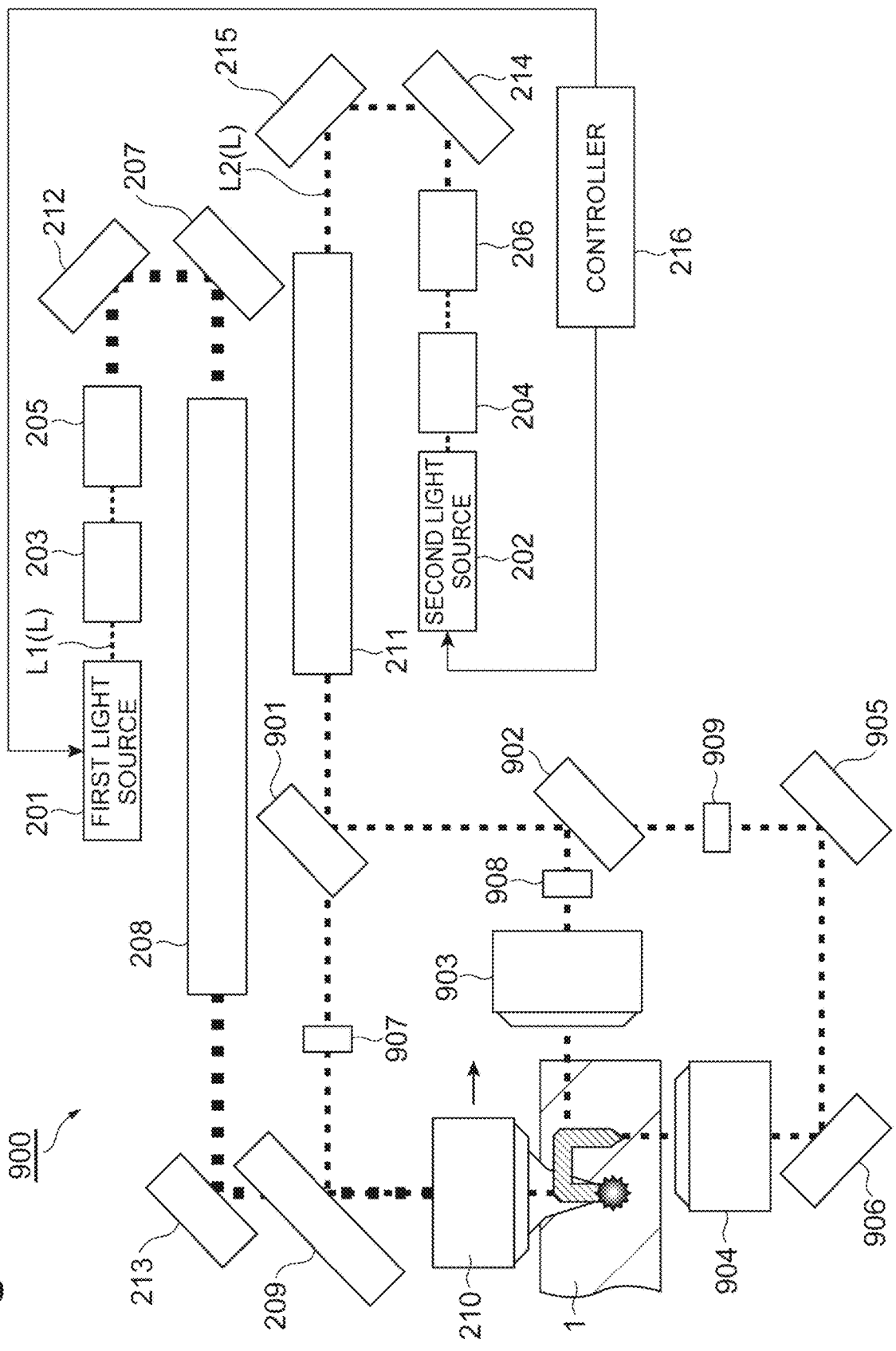
FIG. 23 is a schematic view showing the configuration of a laser processing device according to an eighth embodiment.

A laser processing device 900 according to the eighth embodiment shown in FIG. 23 is a processing device used for manufacturing, for example, an interposer or a microchannel, and is capable of forming the modified region 7 that extends two-dimensionally or three-dimensionally in the object 1. The modified region 7 of the present embodiment is a region to be removed where etching or the like is selectively performed for removal. The laser processing device 900 guides the modified region 7 at an ultra-high speed by irradiating the object 1 with the second laser light L2 from multiple directions.

The laser processing device 900 differs from the laser processing device 200 (see FIG. 9) in the device configuration that the laser processing device 900 further includes half mirrors 901 and 902, condensing optical systems 903 and 904, and shutters 907 to 909. The half mirror 901 is disposed between the cylindrical lens unit 211 and the dichroic mirror 209 on the optical path of the second laser light L2. The half mirror 901 reflects a part of the second laser light L2 that has passed through the cylindrical lens unit 211 and transmits the other part of the second laser light L2.

The half mirror 902 is disposed on the downstream side of the half mirror 901 on the optical path of the second laser light L2. The half mirror 902 reflects a part of the second laser light L2 that has been reflected from the half mirror 901 and transmits the other part of the second laser light L2.

The condensing optical system 903 converges the second laser light L2 reflected from the half mirror 902 at the object 1. The condensing optical system 903 is disposed so as to face a side surface of the object 1. The condensing optical system 903 causes the second laser light L2 to enter with the side surface of the object 1 as the plane of incidence of laser light. The condensing optical system 903 is configured in a manner similar to the condensing optical system 210. The condensing optical system 904 converges the second laser light L2, which has passed through the half mirror 902 and been reflected from the mirrors 905 and 906, at the object 1. The condensing optical system 904 is disposed so as to face the condensing optical system 210 with the object 1 interposed therebetween. The condensing optical system 904 causes the second laser light L2 to enter with the back surface (or front surface) opposite to the front surface (or back surface) that is the plane of incidence of laser light of the condensing optical system 210 as a plane of incidence of laser light. The condensing optical system 904 is configured in a manner similar to the condensing optical system 210. As the condensing optical systems 903 and 904, it is not necessary to use an optical system having a particularly high performance as compared with the condensing optical system 210.

The shutters 907 to 909 are used to interrupt or release the second laser light L2. The shutter 907 is disposed between the half mirror 901 and the dichroic mirror 209 on the optical path of the second laser light L2, for example. The shutter 908 is disposed between the half mirror 902 and the condensing optical system 903 on the optical path of the second laser light L2, for example. The shutter 909 is disposed between the half mirror 902 and the mirror 905 on the optical path of the second laser light L2, for example.

The controller 216 of the present embodiment appropriately switches between the opening and closing of the shutters 907 to 909 to implement multi-directional irradiation of the second laser light L2 to the object 1. For example, the controller 216 opens only one of the shutters 907 to 909 in a timely manner, so that the second laser light L2 can be applied to the object 1 from one of the front surface side, the back surface side, and the side surface side of the object 1. Alternatively, switching of the irradiation direction of the second laser light L2 may be implemented in combination of a plurality of light sources by emitting light at an appropriate time.

In the laser processing device 900, the first laser light L1 has a wavelength near the band gap or longer than the band gap and a steep rising pulse waveform. The first laser light L1 is applied to a removal planned position of the object 1. By such irradiation of the first laser light L1, the temporary induction of the absorption region of the first stage is minimized. On the other hand, the second laser light L2 has a wavelength with which no absorption occurs with respect to the object 1 in the base state, a large energy, and a long pulse duration. The second laser light L2 is applied along a removal planned path of the object 1. By such irradiation of the second laser light L2, the second stage is maintained for a long time, and the modified region 7 effective for etching is formed with an arbitrary length.

The removal planned path is a virtual path for forming a region to be removed in the object 1. The removal planned path is not limited to a straight line, but may be a curved line, a three-dimensional shape in which they are combined, or may be a path in which coordinates are specified. The removal planned path is a path in which to form a modified region. The path in which to form a modified region is a route on which the modified region 7 is to be formed.

The laser processing device 900 herein is configured to have the following characteristics with respect to the first laser light L1 and the second laser light L2 applied to the object 1. Note that a via diameter corresponds to a diameter in a cross section perpendicular to the extending direction in the modified region 7 as the region to be removed.

(Wavelength)
First laser light L1: 1026 to 1064 nm
Second laser light L2: 1180 to 7500 nm
(Beam Quality (M-Squared Value))
First laser light L1: 1.0
Second laser light L2: less than 3.0
(Pulse Duration)
First laser light L1: 10 to 30 ns
Second laser light L2: 0.1 to 5 μs
(Pulse Rise Time)
First laser light L1: less than 3 ns
Second laser light L2: less than 50 ns
(Pulse Waveform)
First laser light L1: rectangular waveform or Gaussian waveform
Second laser light L2: backward rise waveform (square curve)
(Peak Intensity)
First laser light L1: 70 W
Second laser light L2: 80 to 180 W
(Repetition Frequency)
First laser light L1: 80 kHz or less
Second laser light L2: 80 kHz or less
(Irradiation Timing)
First laser light L1: arbitrary
Second laser light L2: 20 to 30 ns later
(Condensing System)
First laser light L1: convergence given priority
Second laser light L2: path given priority
(Aberration Correction)
First laser light L1: yes
Second laser light L2: depends on depth and via diameter
(Symmetry of Beam Profile)
First laser light L1: rotational symmetry (perfect circle)
Second laser light L2: depends on the modified region 7
(NA)
First laser light L1: 0.7 or more
Second laser light L2: 0.05 to 0.4

As described above, the laser processing device 900 also achieves the functional effect by the laser processing device 200. In particular, in the laser processing device 900, the modified region 7 is the region to be removed that extends two-dimensionally or three-dimensionally in the object 1. In such a case, the modified region 7 can be selectively removed by etching or the like, and a space extending two-dimensionally or three-dimensionally can be formed in the object.

In the laser processing device 900, it is possible to apply the second laser light L2 to the object 1 from a desired irradiation direction, and the expansion of the modified region 7 can be guided three-dimensionally at an ultra-high speed. The modified region 7 having a desired three-dimensional shape can be formed in the object 1.

In the laser processing device 900, it may be difficult to align the irradiation direction of the second laser light L2 with the extending direction of the removal planned path due to the limitations on the device configuration. In such a case, the modified region 7 can be extended in a direction other than the irradiation direction of the second laser light L2 by shortening the pulse duration of the second laser light L2 and intermittently applying the second laser light L2 for scanning. The optical system of the laser processing device 900 is not particularly limited to the configuration shown in FIG. 23, and may have another configuration as long as the multi-directional irradiation can be performed on the object 1. For example, the use of a high-speed splitter unit (such as EOM or AOM) enables switching between optical paths instantaneously. In such a case, the utilization efficiency of the output of the second laser light L2 can be greatly improved.

Figure 24:
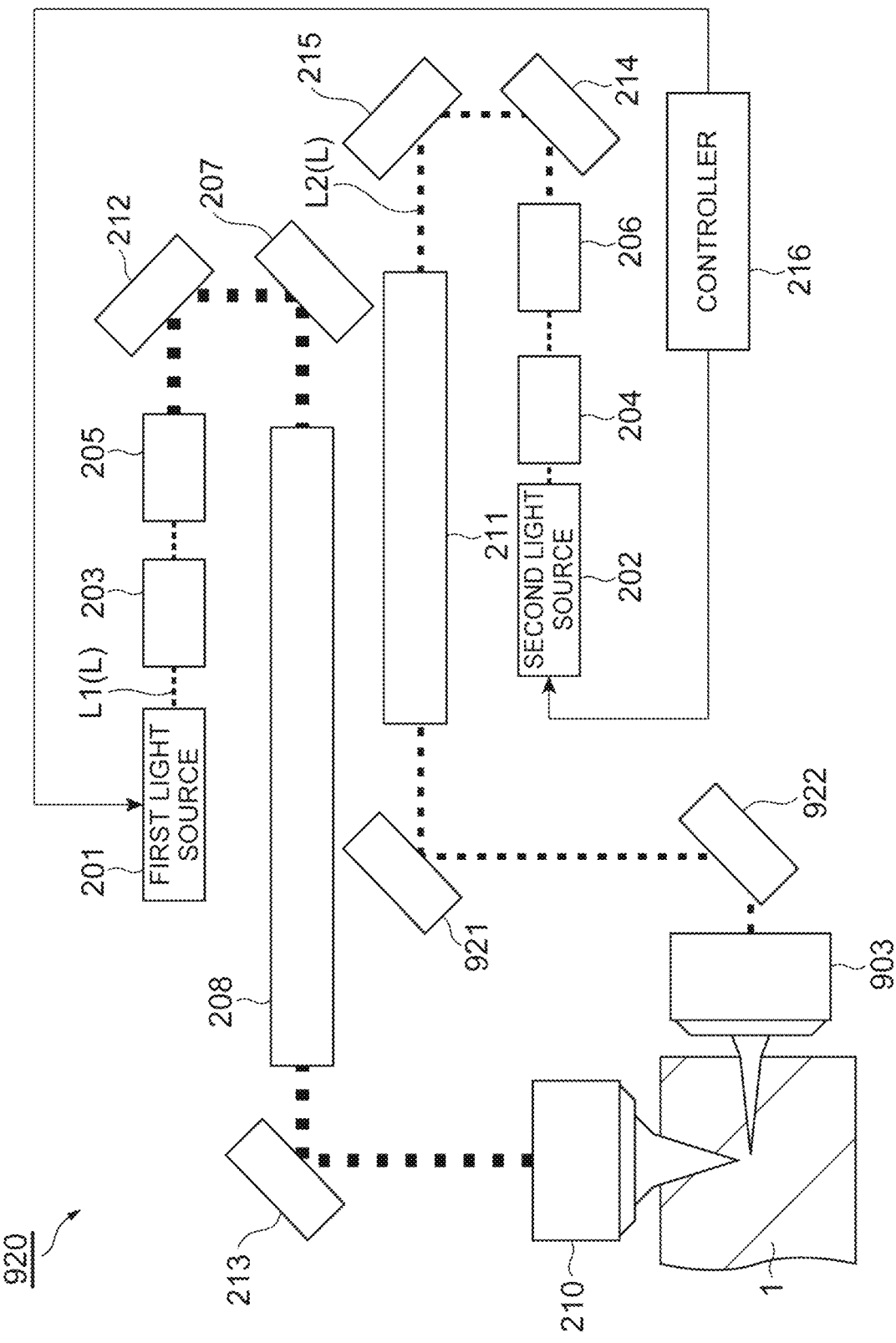
FIG. 24 is a schematic view showing the configuration of a laser processing device according to a modification of the eighth embodiment.

FIG. 24 is a schematic view showing the configuration of a laser processing device 920 according to a modification of the eighth embodiment. The laser processing device 920 according to the modification differs from the laser processing device 900 (see FIG. 23) in the device configuration that the laser processing device 920 does not include the dichroic mirror 209, the half mirrors 901 and 902, the condensing optical system 904, the mirrors 905 and 906, and the shutters 907 to 909. In the laser processing device 920, the condensing optical system 210 converges only the first laser light L1 at the object 1. In the laser processing device 920, the condensing optical system 903 converges the second laser light L2, which has passed through the cylindrical lens unit 211 and been reflected from the mirrors 921 and 922, at the object 1.

In the laser processing device 920, the first laser light L1 has a wavelength with which absorption of the object 1 is large and a steep rising pulse waveform. By irradiation of the first laser light L1, only the first stage is performed in the minimum molten solidified region 11. On the other hand, the second laser light L2 has a wavelength that is completely transparent to the object 1, a large energy, and a long pulse duration. By irradiation of the second laser light L2, the second stage is maintained for a long time, the modified region 7 effective for etching is formed, and the modified region 7 is enlarged to any size.

As described above, the laser processing device 920 also achieves the functional effect by the laser processing device 900. Note that, in the processing by the laser processing device 920, unlike the case where the modified region 7 is formed as the cutting start region inside the object 1, the laser light L is scanned three-dimensionally at a narrow pitch. Therefore, the modified region 7 can be connected by reducing the scan speed and making the processing pitch smaller. In the processing by the laser processing device 920, the modified region 7 can be promoted to an effective state for etching in the second stage.

Ninth Embodiment

The description goes on to a laser processing device according to the ninth embodiment.

Figure 25:
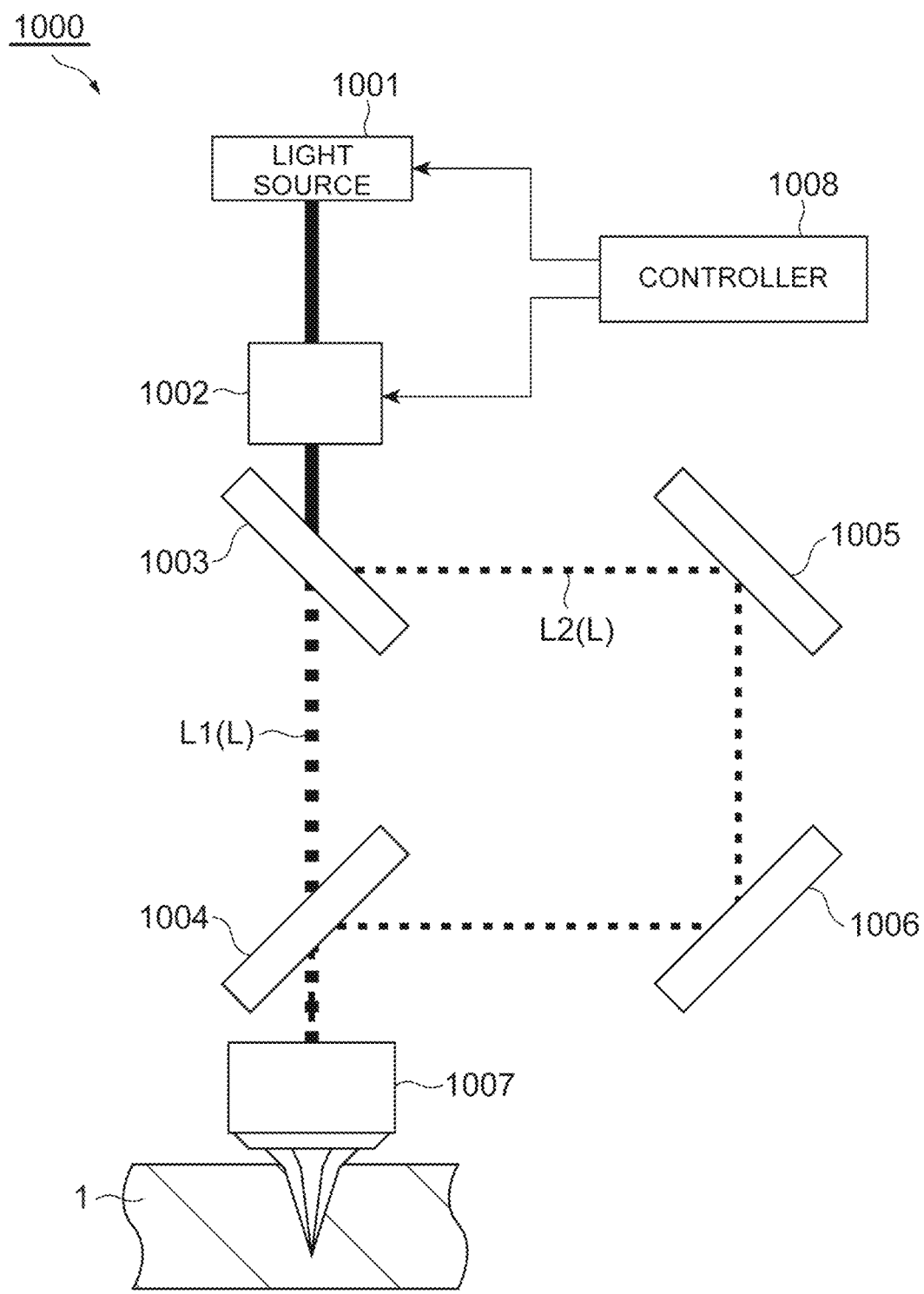
FIG. 25 is a schematic view showing the configuration of a laser processing device according to a ninth embodiment.

A laser processing device 1000 according to the ninth embodiment shown in FIG. 25 uses one light source 1001 to irradiate the object 1 with the first laser light L1 and the second laser light L2. The laser processing device 1000 includes the light source 1001, an external modulator 1002, an optical element for splitting 1003, an optical element for coupling 1004, mirrors 1005 and 1006, a condensing optical system 1007, and a controller 1008.

The light source 1001 emits laser light L of pulsed laser light (causes the laser light L1 to oscillate in a pulsating manner). The external modulator 1002 modulates the laser light L emitted from the light source 1001 in such a manner that the optical element for splitting 1003 suitable for the downstream modulator splits the laser light L in the first laser light L1 and the second laser light L2. The external modulator 1002 is not particularly limited, and may be various modulators.

The optical element for splitting 1003 receives the laser light L modulated by the external modulator 1002 and transmits, as the first laser light L1, the short wavelength side or horizontal or vertical polarization, and reflects, as the second laser light L2, the long wavelength side or vertical or horizontal polarization. The optical element for splitting 1003 is, for example, a dichroic mirror or a polarizer. The optical element for coupling 1004 transmits the first laser light L1 that has passed through the optical element for splitting 1003, and reflects the second laser light L2 that has been reflected from the optical element for splitting 1003 and has been reflected from the mirrors 1005 and 1006. The configuration of the optical element for coupling 1004 is similar to that of the optical element for splitting 1003.

The condensing optical system 1007 converges, at the object 1, the first laser light L1 that has passed through the optical element for coupling 1004 and the second laser light L2 that has been reflected from the optical element for coupling 1004. The condensing optical system 1007 is configured in a manner similar to the condensing optical system 210 (see FIG. 9). The controller 1008 controls the operation of the light source 1001 and the external modulator 1002. The controller 1008 has a function similar to that of the controller 216 (see FIG. 9). The light source 1001, the external modulator 1002, and the controller 1008 constitute a first irradiation unit and a second irradiation unit.

In the laser processing device 1000 configured as described above, the laser light L is emitted from the light source 1001, and the emitted laser light L is modulated by the external modulator 1002. A part of the laser light L modulated by the external modulator 1002 passes through the optical element for splitting 1003 as the first laser light L1. The other part of the laser light L modulated by the external modulator 1002 is reflected from the optical element for splitting 1003 as the second laser light L2.

The first laser light L1 that has passed through the optical element for splitting 1003 passes through the optical element for coupling 1004, and is applied to the object 1 through the condensing optical system 1007. Thereby, the absorptivity of a partial region of the object 1 increases temporarily. In the absorptivity increase period H, the second laser light L2 that has been reflected from the optical element for splitting 1003 is sequentially reflected from the mirrors 1005 and 1006 and the optical element for coupling 1004, and is applied to the partial region of the object 1 through the condensing optical system 1007.

As described above, the laser processing device 1000 also achieves the functional effect by the laser processing device 200. Note that the laser processing device 1000 can be configured using the same single light source 1001.

[Modification]

As described above, the present invention is not limited to the embodiments descried above.

In the embodiments described above, the second light source 202 is not particularly limited, and may be an inexpensive and high-power gas laser or a multimode laser light source. As the second light source 202, for example, a laser light source having a wavelength of 1.8 to 2.3 μm, which is widely used for dental or cosmetic surgery purposes, can be used. Further, at least one of the first light source 201 and the second light source 202 is not necessarily a laser light source, and may be a lamp or the like that outputs incoherent light, a plasma light source, or a microwave oscillator that generates a microwave.

In the embodiments described above, the number of second light sources 202 is not particularly limited, and two or more second light sources 202 may be provided. In such a case, during the absorptivity increase period H in which the absorptivity of a partial region is temporarily increased, the plurality of second light sources 202 apply a plurality of second laser lights L2 sequentially and at least a part of the second light sources 202 is irradiated simultaneously.

In the embodiments described above, the first laser light L1 and the second laser light L2 are made incident from the vertical direction with respect to the front surface, the back surface, or the side surface of the object 1; however, are not limited thereto. At least one of the first laser light L1 and the second laser light L2 may be made incident from an inclination direction inclined with respect to the vertical direction.

The processing device according to one aspect of the present invention may be applied to processing other than the processing described above, and may be applied to anything as long as the modified region 7 is formed in the object 1. For example, the modified region 7 may be a crystalline region, a recrystallization region, or a gettering region formed inside the object 1. The crystalline region is a region where the structure of the object 1 before processing is maintained. The recrystallization region is a region solidified as a single crystal or a polycrystal at the time of resolidification after being once evaporated, plasmatized, or melted. The gettering region is a region that exhibits a gettering effect of collecting and capturing impurities such as heavy metals, and may be formed continuously or intermittently. Further, for example, the processing device may be used for processing such as ablation.

One aspect of the present invention can also be regarded as a laser processing device, a modified region forming device, or a chip manufacturing device. Further, one aspect of the present invention can be regarded as a processing method, a laser processing method, a method for forming a modified region, or a method for manufacturing a chip. In each of the embodiments and the modifications, at least a part of the configurations of the other embodiments and the modifications may be appropriately combined.

REFERENCE SIGNS LIST

1 Workpiece
7 Modified region
100, 200, 220, 230, 240, 300, 320, 400, 420, 500, 600, 700, 800, 820, 900, 1000 Laser processing device (processing device)
201 First light source (first irradiation unit)
202 Second light source (second irradiation unit)
216 Controller (first irradiation unit, second irradiation unit)
1001 Light source (first irradiation unit, second irradiation unit)
1002 External modulator (first irradiation unit, second irradiation unit)
1008 Controller (first irradiation unit, second irradiation unit)
L1 First laser light (first light)
L2 Second laser light (second light)
S Modified spot

The invention claimed is:

1. A processing device for forming, in an object to be processed, a modified spot constituting a modified region, the processing device comprising:
   a first irradiation unit configured to irradiate the object with first light to temporarily increase absorptivity in a partial region of the object as compared with the absorptivity before irradiation of the first light; and
   a second irradiation unit configured to irradiate the partial region with second light in an absorptivity increase period in which the absorptivity of the partial region is temporarily increased,
   wherein a wavelength of the second light is longer than a wavelength of the first light,
   wherein the wavelength of the second light is 1000-8500 nm, and
   wherein an M-squared value of the second light is greater than an M-squared value of the first light.

2. The processing device according to claim 1, wherein energy of the second light is greater than energy of the first light.

3. The processing device according to claim 1, wherein peak intensity of the second light is lower than peak intensity of the first light.

4. The processing device according to claim 1, wherein the second light is light with which no modified spot is formed when being singly applied to the object.

5. The processing device according to claim 1, wherein an irradiation direction of the second light with respect to the object is different from an irradiation direction of the first light with respect to the object.

6. The processing device according to claim 1, wherein an angle at which the second light converges on a condensing position of the second light is different from an angle at which the first light converges on a condensing position of the first light.

7. The processing device according to claim 1, wherein a beam profile of the second light is different from a beam profile of the first light.

8. The processing device according to claim 1, wherein a pulse width of the second light is different from a pulse width of the first light.

9. The processing device according to claim 1, wherein a pulse waveform of the second light is different from a pulse waveform of the first light.

10. The processing device according to claim 1, wherein a polarization direction of the second light is different from a polarization direction of the first light.

11. The processing device according to claim 1, wherein the modified region is a cutting start region for cutting the object along a thickness direction.

12. The processing device according to claim 1, wherein the modified region is a cutting start region for cutting the object along a direction intersecting a thickness direction.

13. The processing device according to claim 1, wherein the modified region is a region to be removed that extends two-dimensionally or three-dimensionally in the object.

14. The processing device according to claim 1, wherein the modified region is a crystalline region, a recrystallization region, or a gettering region formed inside the object.

15. The processing device according to claim 1, wherein the first irradiation unit includes a first light source configured to emit the first light, and the second irradiation unit includes a second light source configured to emit the second light and a controller configured to control irradiation timing of the second light source such that the second light is applied to the partial region during the absorptivity increase period.

16. The processing device according to claim 1, wherein
   the first irradiation unit and the second irradiation unit include a light source and an external modulator configured to modulate light emitted from the light source,
   a part of the light emitted from the light source and modulated by the external modulator is applied to the object as the first light, and
   another part of the light emitted from the light source and modulated by the external modulator is applied to the partial region as the second light during the absorptivity increase period.

* * * * *